(12) United States Patent
Yamada et al.

(10) Patent No.: US 12,302,652 B2
(45) Date of Patent: May 13, 2025

(54) IMAGING DEVICE

(71) Applicant: Panasonic Intellectual Property Management Co., Ltd., Osaka (JP)

(72) Inventors: Takayoshi Yamada, Hyogo (JP); Yoshihiro Sato, Osaka (JP); Taiji Noda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 590 days.

(21) Appl. No.: 17/483,655

(22) Filed: Sep. 23, 2021

(65) Prior Publication Data

US 2022/0014700 A1 Jan. 13, 2022

Related U.S. Application Data

(63) Continuation of application No. PCT/JP2020/016232, filed on Apr. 13, 2020.

(30) Foreign Application Priority Data

Apr. 26, 2019 (JP) ................................. 2019-086522
Mar. 27, 2020 (JP) ................................. 2020-058624

(51) Int. Cl.
*H10F 39/00* (2025.01)
*H10F 39/18* (2025.01)

(52) U.S. Cl.
CPC ......... *H10F 39/8033* (2025.01); *H10F 39/18* (2025.01); *H10F 39/8037* (2025.01); *H10F 39/8053* (2025.01)

(58) Field of Classification Search
CPC ......... H01L 27/14603; H01L 27/14647; H01L 27/14665; H10F 39/812; H10F 39/1825; H10F 39/8027; H10F 39/8033
See application file for complete search history.

(56) References Cited

U.S. PATENT DOCUMENTS

2005/0219392 A1 10/2005 Suzuki
2005/0264662 A1\* 12/2005 Suzuki .............. H01L 27/14603
348/294

(Continued)

FOREIGN PATENT DOCUMENTS

CN 110191294 A 8/2019
EP 3833015 A1 6/2021

(Continued)

OTHER PUBLICATIONS

International Search Report of PCT application No. PCT/JP2020/016232 dated Jun. 30, 2020.

(Continued)

*Primary Examiner* — Thanh Luu
(74) *Attorney, Agent, or Firm* — Rimon P.C.

(57) ABSTRACT

An imaging device includes a semiconductor substrate and pixels, which includes a first pixel and second pixels adjacent thereto. Each of the pixels includes a first photoelectric conversion layer, a first pixel electrode, a first plug that electrically connects the semiconductor substrate and the first pixel electrode, a second photoelectric conversion layer, a second pixel electrode, and a second plug that electrically connects the semiconductor substrate and the second pixel electrode. In the first pixel and the plurality of second pixels, a distance between the closest plugs of the first plugs and the second plugs is larger than or equal to one-half of a pixel pitch, when viewed in a normal direction of the semiconductor substrate.

18 Claims, 14 Drawing Sheets

(56) References Cited

U.S. PATENT DOCUMENTS

| | | |
|---|---|---|
| 2011/0220778 A1 | 9/2011 | Inaba |
| 2012/0204960 A1 | 8/2012 | Kato et al. |
| 2012/0313142 A1 | 12/2012 | Suzuki et al. |
| 2015/0144904 A1 | 5/2015 | Jeong et al. |
| 2016/0119563 A1* | 4/2016 | Yamada ............... H04N 25/76 348/312 |
| 2016/0240571 A1 | 8/2016 | Baek |
| 2016/0360134 A1 | 12/2016 | Miyake |
| 2017/0148841 A1 | 5/2017 | Matsumoto et al. |
| 2017/0163917 A1 | 6/2017 | Yamada et al. |
| 2017/0263669 A1 | 9/2017 | Tamaki et al. |
| 2019/0019823 A1 | 1/2019 | Ooki et al. |
| 2019/0214417 A1 | 7/2019 | Matsuo |
| 2019/0260952 A1* | 8/2019 | Lee .................. H01L 27/14603 |
| 2020/0029038 A1 | 1/2020 | Uesugi et al. |
| 2020/0076999 A1 | 3/2020 | Akiyama et al. |
| 2021/0249474 A1 | 8/2021 | Togashi et al. |

FOREIGN PATENT DOCUMENTS

| | | |
|---|---|---|
| JP | 2002-083946 A | 3/2002 |
| JP | 2005-268471 | 9/2005 |
| JP | 2005-340572 | 12/2005 |
| JP | 2006-093521 A | 4/2006 |
| JP | 2006-210397 A | 8/2006 |
| JP | 2008-288404 A | 11/2008 |
| JP | 2009-054806 | 3/2009 |
| JP | 2011-119694 A | 6/2011 |
| JP | 2011-187725 | 9/2011 |
| JP | 2011-238781 A | 11/2011 |
| JP | 2013-055252 A | 3/2013 |
| JP | 2016-096233 A | 5/2016 |
| JP | 2016-152417 A | 8/2016 |
| JP | 2018-046039 A | 3/2018 |
| WO | 2011/141974 A1 | 11/2011 |
| WO | 2016/002576 A1 | 1/2016 |
| WO | 2018/173754 A1 | 9/2018 |
| WO | 2018/190126 | 10/2018 |
| WO | 2019/240121 A1 | 12/2019 |
| WO | 2020/026720 A1 | 2/2020 |

OTHER PUBLICATIONS

International Search Report of PCT application No. PCT/JP2020/016235 dated Jun. 23, 2020.
International Search Report of PCT application No. PCT/JP2020/016233 dated Jun. 30, 2020.
Non-Final Office Action dated Mar. 18, 2024 issued in U.S. Appl. No. 17/474,521.
Non-Final Office Action dated Feb. 13, 2024 issued in U.S. Appl. No. 17/494,202.
English Translation of Chinese Search Report dated Jan. 22, 2025 for the related Chinese Patent Application No. 202080016264.X.

* cited by examiner

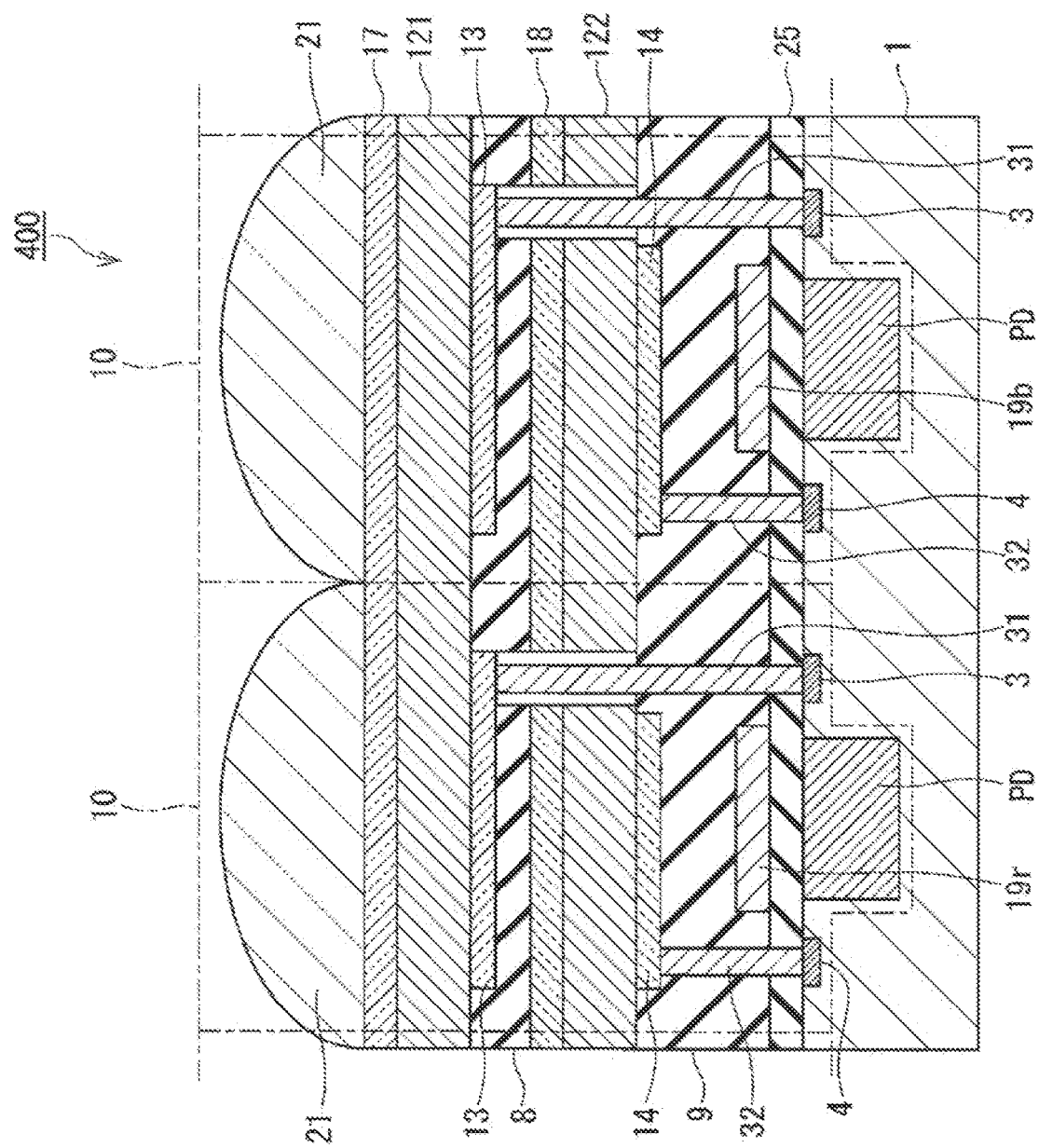

IMAGING DEVICE

BACKGROUND

1. Technical Field

The present disclosure relates to imaging devices.

2. Description of the Related Art

Heretofore, imaging devices utilizing photoelectric conversion have been widely used.

Japanese Unexamined Patent Application Publication No. 2005-268471 discloses an imaging device having a plurality of photoelectric conversion films.

SUMMARY

In one general aspect, the techniques disclosed here feature an imaging device including: a semiconductor substrate; and a plurality of pixels. Each of the plurality of pixels includes: a first photoelectric conversion layer that converts light into first charge; a first pixel electrode that collects the first charge; a first plug that electrically connects the semiconductor substrate and the first pixel electrode; a second photoelectric conversion layer that is arranged between the first photoelectric conversion layer and the semiconductor substrate and that converts light into second charge; a second pixel electrode that collects the second charge, and a second plug that electrically connects the semiconductor substrate and the second pixel electrode. The plurality of pixels includes a first pixel and a plurality of second pixels that is adjacent to the first pixel. The plurality of pixels includes a plurality of first plugs and a plurality of second plugs, each of the plurality of first plugs being the first plug, each of the plurality of second plugs being the second plug. A distance between the closest plugs of the plurality of first plugs and the plurality of second plugs is larger than or equal to one-half of a pixel pitch, the pixel pitch being a distance between a center of the first pixel and a center of a closest second pixel of the plurality of second pixels, the center of the closest second pixel being closest to the center of the first pixel among the plurality of second pixels, when viewed in a normal direction of the semiconductor substrate.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 11A is a sectional view of an imaging device according to a fourth embodiment of the present disclosure;

Figure 1:
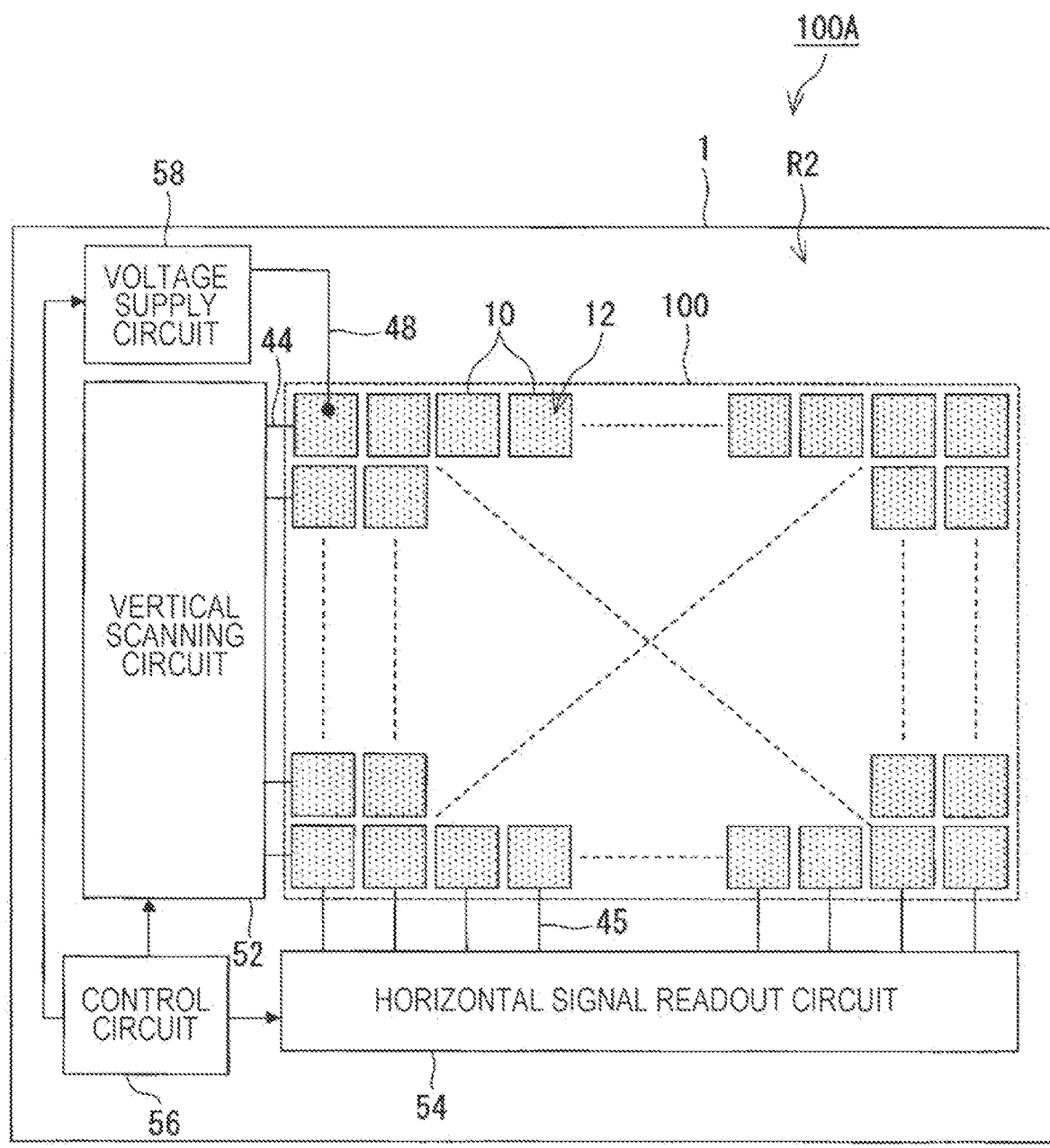
FIG. 1 is a block diagram of an imaging apparatus according to a first embodiment of the present disclosure.

DETAILED DESCRIPTION (Findings Underlying the Present Disclosure)

Imaging devices each have, for example, a semiconductor substrate and a photoelectric conversion film arranged at an upper side thereof. In recent years, in order to further increase the density of pixels, imaging devices having a laminated structure of photoelectric conversion films have been proposed, as disclosed in Japanese Unexamined Patent Application Publication No. 2005-268471.

The present inventors have conducted studies on causes of hampering improvement of the image quality of the imaging devices. As a result, the present inventors have found the following problems.

The imaging devices each have plugs that connect pixel electrodes and a semiconductor substrate. As the density of pixels increases, crosstalk between the plugs becomes obvious. The crosstalk between the plugs causes color mixing in an image to be acquired. For example, when crosstalk occurs between plugs corresponding to different colors, such as red (R) and green (G), G and blue (B), and B and R, a color difference between a subject and an image acquired becomes prominent. Suppressing the crosstalk between the plugs is beneficial in improving the image quality.

The crosstalk between the plugs is presumed to become obvious in the imaging device having the structure disclosed in Japanese Unexamined Patent Application Publication No. 2005-268471.

The present disclosure provides a technology for suppressing the crosstalk between plugs.

(Overview of One Aspect According to the Present Disclosure)

An imaging device according to a first aspect of the present disclosure includes:
  a semiconductor substrate; and
  a plurality of pixels.
  Each of the plurality of pixels includes:
  a first photoelectric conversion layer that converts light into first charge;
  a first pixel electrode that collects the first charge;
  a first plug that electrically connects the semiconductor substrate and the first pixel electrode;
  a second photoelectric conversion layer that is arranged between the first photoelectric conversion layer and the semiconductor substrate and that converts light into second charge;
  a second pixel electrode that collects the second charge; and
  a second plug that electrically connects the semiconductor substrate and the second pixel electrode.

The plurality of pixels includes a first pixel and a plurality of second pixels that is adjacent to the first pixel.

The plurality of pixels includes a plurality of first plugs and a plurality of second plugs, each of the plurality of first plugs being the first plug, each of the plurality of second plugs being the second plug.

A distance between the closest plugs of the plurality of first plugs and the plurality of second plugs is larger than or equal to one-half of a pixel pitch, the pixel pitch being a distance between a center of the first pixel and a center of a closest second pixel of the plurality of second pixels, the center of the closest second pixel being closest to the center of the first pixel among the plurality of second pixels, when viewed in a normal direction of the semiconductor substrate.

According to the first aspect, since the plugs are sufficiently away from each other in the first pixel and the plurality of second pixels adjacent to the first pixel, it is possible to suppress crosstalk between the plugs in the first pixel and the plurality of second pixels adjacent to the first pixel. As a result, it is possible to suppress color mixing in an image to be acquired.

The plurality of pixels may be two dimensionally arrayed along a first direction and a second direction orthogonal to the first direction.

The plurality of second pixels may include
  a pixel that is adjacent to the first pixel in the first direction,
  a pixel that is adjacent to the first pixel in a direction opposite to the first direction,
  a pixel that is adjacent to the first pixel in the second direction,
  a pixel that is adjacent to the first pixel in a direction opposite to the second direction,
  a pixel that is adjacent to the first pixel in a third direction between the first direction and the second direction,
  a pixel that is adjacent to the first pixel in a direction opposite to the third direction,
  a pixel that is adjacent to the first pixel in a fourth direction orthogonal to the third direction, and
  a pixel that is adjacent to the first pixel in a direction opposite to the fourth direction.

In a second aspect of the present disclosure, for example, in the imaging device according to the first aspect, a distance between the first plug and the second plug in each of the plurality of pixels may be larger than or equal to one-half of the pixel pitch, when viewed in the normal direction of the semiconductor substrate. According to this configuration, it is possible to further suppress crosstalk between the plugs in each pixel.

According to a third aspect of the present disclosure, for example, in the imaging device according to the first or second aspect, each of the plurality of pixels may further include a third photoelectric conversion layer that is arranged between the second photoelectric conversion layer and the semiconductor substrate and that converts light into third charge, a third pixel electrode that collects the third charge, and a third plug that electrically connects the semiconductor substrate and the third pixel electrode. The three-layer structure is suitable for forming full-color images.

In a fourth aspect of the present disclosure, for example, in the imaging device according to the third aspect, a distance between the first plug and the third plug in each of the plurality of pixels may be larger than or equal to one-half of the pixel pitch, when viewed in the normal direction of the semiconductor substrate. According to this configuration, it is possible to further suppress crosstalk between the plugs in each pixel.

In a fifth aspect of the present disclosure, for example, in the imaging device according to the third or fourth aspect, a distance between the second plug and the third plug in each of the plurality of pixels may be larger than or equal to one-half of the pixel pitch, when viewed in the normal direction of the semiconductor substrate. According to this configuration, it is possible to further suppress crosstalk between the plugs in each pixel.

In a sixth aspect of the present disclosure, for example, in the imaging device according to one of the third to fifth aspects, in each of the plurality of pixels, a distance between the first plug and the second plug may be larger than a distance between the first plug and the third plug and may be larger than a distance between the second plug and the third plug, when viewed in the normal direction of the semiconductor substrate. According to this configuration, it is possible to more effectively suppress crosstalk.

In a seventh aspect of the present disclosure, for example, the imaging device according to one of the first to sixth aspects may further include a shield electrode between the first pixel and each of the plurality of second pixels, the shield electrode being maintained at a certain potential. According to this configuration, it is possible to further suppress crosstalk between the plugs in the adjacent pixels.

An imaging device according to an eighth aspect of the present disclosure includes:
a semiconductor substrate;
a first photoelectric conversion layer that converts light into first charge;
a first pixel electrode that collects the first charge;
a first plug that electrically connects the semiconductor substrate and the first pixel electrode;
a second photoelectric conversion layer that is arranged between the first photoelectric conversion layer and the semiconductor substrate and that converts light into second charge;
a second pixel electrode that collects the second charge; and
a second plug that electrically connects the semiconductor substrate and the second pixel electrode.

The first pixel electrode has a long side and a short side, and
when viewed in a normal direction of the semiconductor substrate, a distance between the first plug and the second plug is larger than the long side of the first pixel electrode.

According to the eighth aspect, crosstalk due to coupling between the first plug and the second plug is suppressed in each pixel. As a result, it is possible to suppress color mixing in an image to be acquired.

According to a ninth aspect of the present disclosure, for example, the imaging device according to the eighth aspect may further include: a third photoelectric conversion layer that is arranged between the second photoelectric conversion layer and the semiconductor substrate and that converts light into third charge; a third pixel electrode that collects the third charge; and a third plug that electrically connects the semiconductor substrate and the third pixel electrode. The three-layer structure is suitable for forming full-color images.

In a tenth aspect of the present disclosure, for example, in the imaging device according to the ninth aspect, the third plug may be arranged in a center region of the third pixel electrode, the center region being a region including a barycenter of the third pixel electrode. According to this configuration, design freedom of a charge accumulation region and a transistor connected to the third plug improves.

An imaging device according to an 11th aspect of the present disclosure includes:
a semiconductor substrate;
a first photoelectric conversion layer that converts light into first charge;
a first pixel electrode that collects the first charge;
a second photoelectric conversion layer that is arranged between the first photoelectric conversion layer and the semiconductor substrate and that converts light into second charge; and
a second pixel electrode that collects the second charge.

The second pixel electrode has a plurality of sides, and when viewed in a normal direction of the semiconductor substrate, the first pixel electrode and the second pixel electrode are arranged displaced from each other by one-half or more of each length of the plurality of sides of the second pixel electrode.

According to the 11th aspect, crosstalk between the plugs or crosstalk between the charge accumulation regions can be suppressed without provision of notches or penetrating holes in the second photoelectric conversion layer.

In a 12th aspect of the present disclosure, for example, the imaging device according to the 11th aspect may further include a first plug that electrically connects the semiconductor substrate and the first pixel electrode, and the first plug may be arranged in a center region of the first pixel electrode, the center region being a region including a barycenter of the first pixel electrode. According to this configuration, a penetrating hole for passage of the first plug does not have to be provided in the second pixel electrode.

In a 13th aspect of the present disclosure, for example, the imaging device according to the 11th or 12th aspect may further include a second plug that electrically connects the semiconductor substrate and the second pixel electrode.

In a 14th aspect of the present disclosure, for example, in the imaging device according to one of the first to 13th aspects, the first plug and the second plug may be arranged at positions at diagonal corners of the first pixel electrode. According to this configuration, it is possible to more effectively suppress crosstalk between the plugs.

In a 15th aspect of the present disclosure, for example, in the imaging device according to one of the first to 14th aspects, the first pixel electrode may include a first accumulation electrode that causes the first charge to be accumulated at the first photoelectric conversion layer, and a first readout electrode that is electrically connected to the semiconductor substrate via the first plug, and the second pixel electrode may include a second accumulation electrode that causes the second charge to be accumulated at the second photoelectric conversion layer, and a second readout electrode that is electrically connected to the semiconductor substrate via the second plug.

An imaging device according to a 16th aspect of the present disclosure includes:
a semiconductor substrate;
a plurality of pixels.
Each of the plurality of pixels includes
a first photoelectric conversion layer,
a first pixel electrode that collects charge generated in the first photoelectric conversion layer,
a first plug that provides electrical connection between the semiconductor substrate and the first pixel electrode,
a second photoelectric conversion layer that is arranged between the first photoelectric conversion layer and the semiconductor substrate,
a second pixel electrode that collects charge generated in the second photoelectric conversion layer, and
a second plug that provides electrical connection between the semiconductor substrate and the second pixel electrode.

A distance between the closest plugs in the pixels that are adjacent to each other is larger than or equal to one-half of a pixel pitch, when the imaging device is viewed in a normal direction of the semiconductor substrate.

According to the 16th aspect, since the plugs in the adjacent pixels are sufficiently away from each other, it is possible to suppress crosstalk between the plugs in the adjacent pixels. As a result, it is possible to suppress color mixing in an image to be acquired.

Embodiments of the present disclosure will be described below with reference to the accompanying drawings. The present disclosure is not limited to the embodiments described below.

First Embodiment

FIG. 1 illustrates a configuration of an imaging apparatus 100A according to a first embodiment of the present disclosure. The imaging apparatus 100A includes an imaging device 100. The imaging device 100 includes a semiconductor substrate 1 and a plurality of pixels 10. The plurality of pixels 10 is provided at the semiconductor substrate 1. The pixels 10 are supported by the semiconductor substrate 1. The pixels 10 may be partly constituted by the semiconductor substrate 1.

The semiconductor substrate 1 can be a circuit substrate including various electronic circuits. The semiconductor substrate 1 is implemented by, for example, a silicon (Si) substrate.

The pixels 10 include photoelectric converters 12, respectively. Upon receiving incident light, each photoelectric converter 12 generates positive charge and negative charge, typically, hole-electron pairs. Each photoelectric converter 12 includes at least one photoelectric conversion layer arranged at an upper side of the semiconductor substrate 1. In FIG. 1, the photoelectric converters 12 in the pixels 10 are illustrated spatially separately from one another. This, however, is for merely convenience of description. The photoelectric converters 12 in the pixels 10 can be continuously arranged at the semiconductor substrate 1, without gaps being interposed between the photoelectric converters 12. In other words, the photoelectric converters 12 in the adjacent pixels 10 can be electrically connected to each other.

In FIG. 1, the pixels 10 are arrayed in a plurality of rows by a plurality of columns, that is, m rows by n columns, where m and n individually represent integers greater than or equal to 1. The pixels 10 are, for example, two-dimensionally arrayed at the semiconductor substrate 1 to form an imaging region. When the imaging apparatus 100A is viewed in plan view, the imaging device 100 can be defined as a region in which at least one photoelectric conversion layer lies.

In the pixels arrayed in the m rows by n columns, when the pixels arranged in x rows by y columns are represented by (x, y), the pixels that are adjacent to (x, y) are represented by (x−1, y−1), (x, y−1), (x+1, y−1), (x−1, y), (x+1, y), (x−1, y+1), (x, y+1), and (x+1, y+1), where x is a natural number less than or equal to m, and y is a natural number less than or equal to n.

The number of pixels 10 and the arrangement thereof are not particularly limiting. In FIG. 1, the center of each pixel 10 is located at a grid point of a square grid. The pixels 10 may be arranged so that the center of each pixel 10 is located at a grid point of a triangular grid, a hexagonal grid, or the like. When the pixels 10 are arrayed one-dimensionally, the imaging device 100 can be used as a line sensor.

The imaging apparatus 100A has peripheral circuitry formed at the semiconductor substrate 1.

The peripheral circuitry includes a vertical scanning circuit 52 and a horizontal signal readout circuit 54. The peripheral circuitry can additionally include a control circuit 56 and a voltage supply circuit 58. The peripheral circuitry may further include a signal processing circuit, an output circuit, and so on. These circuits are provided at the semiconductor substrate 1. Part of the peripheral circuitry may be arranged at another substrate different from the semiconductor substrate 1 at which the pixels 10 are formed.

The vertical scanning circuit 52 is also referred to as a "row scanning circuit". Address signal lines 44 are provided corresponding to the rows of the pixels 10 and are connected to the vertical scanning circuit 52. Signal lines provided corresponding to the rows of the pixels 10 are not limited to the address signal lines 44, and a plurality of types of signal line provided for each of the rows of the pixels 10 can be connected to the vertical scanning circuit 52 for the. The horizontal signal readout circuit 54 is also called a column scanning circuit. Vertical signal lines 45 are provided corresponding to the columns of the pixels 10 and are connected to the horizontal signal readout circuit 54.

The control circuit 56 receives command data, a clock signal, and so on given from outside of the imaging apparatus 100A and controls the entire imaging apparatus 100A. Typically, the control circuit 56 has a timing generator and supplies drive signals to the vertical scanning circuit 52, the horizontal signal readout circuit 54, the voltage supply circuit 58, and so on. The control circuit 56 can be implemented by, for example, a microcontroller including one or more processors. Functions of the control circuit 56 may be realized by a combination of a general-purpose processing circuit and software or may be realized by hardware dedicated to processing as described above.

The voltage supply circuit 58 supplies a predetermined voltage to the pixels 10 through a voltage line 48. The voltage supply circuit 58 is not limited to a particular power supply circuit. The voltage supply circuit 58 may be a circuit that converts a voltage, supplied from a power source such as a battery, into the predetermined voltage or may be a circuit that generates the predetermined voltage. The voltage supply circuit 58 may be a portion of the vertical scanning circuit 52. Those circuits included in the peripheral circuitry can be arranged in a peripheral region R2 outside the imaging device 100.

Figure 2:
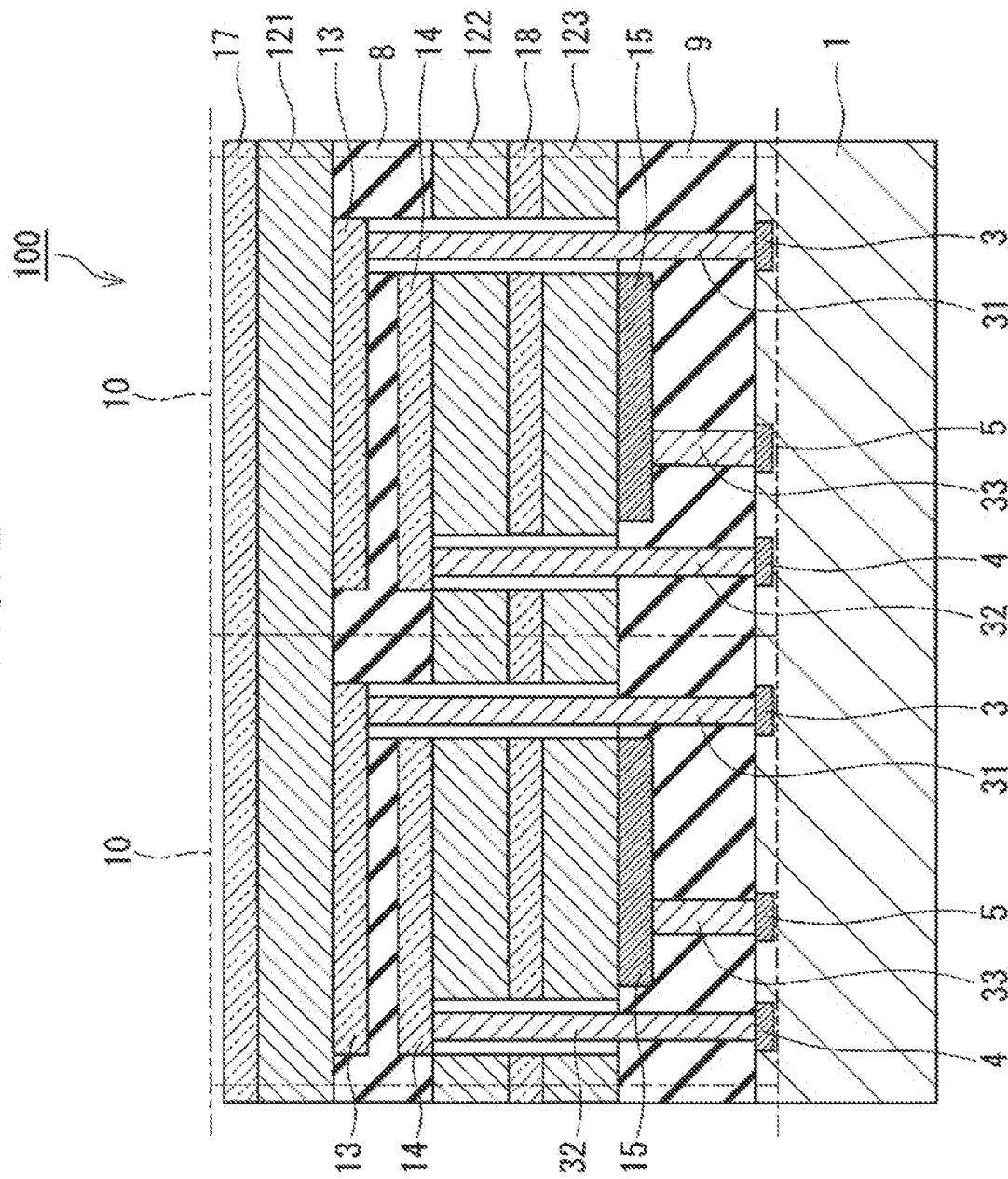
FIG. 2 is a sectional view of the imaging device illustrated in FIG. 1.

FIG. 2 illustrates a cross section of the imaging device 100.

Each pixel 10 has a plurality of photoelectric conversion layers. The photoelectric conversion layers include a first photoelectric conversion layer 121, a second photoelectric conversion layer 122, and a third photoelectric conversion layer 123. The first photoelectric conversion layer 121 may be a single layer shared by two or more pixels 10. The second photoelectric conversion layer 122 may be a single layer shared by two or more pixels 10. The third photoelectric conversion layer 123 may be a single layer shared by two or more pixels 10. However, each of the first photoelectric conversion layer 121, the second photoelectric conversion layer 122, and the third photoelectric conversion layer 123 may be sectioned for each pixel 10. The expression "shared by two or more pixels" means being shared by a particular pixel and at least one pixel adjacent to the particular pixel.

The first photoelectric conversion layer 121, the second photoelectric conversion layer 122, and the third photoelectric conversion layer 123 are made of photoelectric conversion material. The photoelectric conversion material is, typically, organic material.

The first photoelectric conversion layer 121 collects charge (first charge) corresponding to light in a first wavelength range. The second photoelectric conversion layer 122 collects charge (second charge) corresponding to light in a second wavelength range. The third photoelectric conversion layer 123 collects charge (third charge) corresponding to light in a third wavelength range. The first wavelength range is, for example, a wavelength range of blue light. The first photoelectric conversion layer 121 is made of material having sensitivity to blue light. The second wavelength range is, for example, a wavelength range of green light. The second photoelectric conversion layer 122 is made of material having sensitivity to green light. The third wavelength range is, for example, a wavelength range of red light. The third photoelectric conversion layer 123 is made of material having sensitivity to red light.

In the present embodiment, the first photoelectric conversion layer 121, the second photoelectric conversion layer 122, the third photoelectric conversion layer 123, and the semiconductor substrate 1 are arranged in that order. The second photoelectric conversion layer 122 is arranged between the first photoelectric conversion layer 121 and the semiconductor substrate 1 in a normal direction of the semiconductor substrate 1. The third photoelectric conversion layer 123 is arranged between the second photoelectric conversion layer 122 and the semiconductor substrate 1 in the normal direction of the semiconductor substrate 1. The arrangement order of the first photoelectric conversion layer 121, the second photoelectric conversion layer 122, and the third photoelectric conversion layer 123 is not limited to that described above.

Each pixel 10 further includes a plurality of pixel electrodes. The pixel electrodes include a first pixel electrode 13, a second pixel electrode 14, and a third pixel electrode 15. The first pixel electrode 13 is electrically connected to the first photoelectric conversion layer 121. The second pixel electrode 14 is electrically connected to the second photoelectric conversion layer 122. The third pixel electrode 15 is electrically connected to the third photoelectric conversion layer 123.

The first pixel electrode 13 and the second pixel electrode 14 are transparent electrodes that are transmissive to visible light and/or near infrared light. The transparent electrodes are made of transparent conductive oxide, such as indium tin oxide (ITO). The third pixel electrode 15 is a non-transparent electrode that is not transmissive to visible light and/or near infrared light. Examples of material of the non-transparent electrode include metal, metal oxide, metal nitride, and electrically conductive polysilicon.

Herein, "being transmissive" means that the transmittance of light in a particular wavelength range is 40% or more. The wavelength range of visible light is, for example, 400 to 780 nm. The wavelength range of near infrared light is, for example, 780 to 2000 nm. The transmittance can be calculated using a method specified by Japanese Industrial Standard (JIS) R3106 (1998).

An insulating layer 8 is provided between the first pixel electrode 13 and the second pixel electrode 14. An insulating layer 9 is provided between the third pixel electrode 15 and the semiconductor substrate 1. The insulating layers 8 and 9 are made of insulating material, such as silicon dioxide ($SiO_2$).

The pixels 10 further have a plurality of counter electrodes. The counter electrodes include a first counter electrode 17 and a second counter electrode 18. The first counter electrode 17 and the second counter electrode 18 are each shared by two or more pixels 10. Each of the first counter electrode 17 and the second counter electrode 18 is a transparent electrode that is transmissive to visible light and/or near infrared light.

The first counter electrode 17 is provided corresponding to the first pixel electrode 13. The first photoelectric conversion layer 121 is sandwiched between the first counter electrode 17 and the first pixel electrode 13. The second counter electrode 18 is provided corresponding to the second pixel electrode 14 and the third pixel electrode 15. The second photoelectric conversion layer 122 is sandwiched between the second counter electrode 18 and the second pixel electrode 14. The third photoelectric conversion layer 123 is sandwiched between the second counter electrode 18 and the third pixel electrode 15. The first counter electrode 17 is electrically connected to the first photoelectric conversion layer 121. The second counter electrode 18 is electrically connected to the second photoelectric conversion layer 122. The second counter electrode 18 is electrically connected to the third photoelectric conversion layer 123.

In the present embodiment, the second counter electrode 18 applies a voltage to both the second photoelectric conversion layer 122 and the third photoelectric conversion layer 123. The second counter electrode 18, however, may be adapted to apply a voltage to only the second photoelectric conversion layer 122. In this case, a third counter electrode may also be provided to apply a voltage to the third photoelectric conversion layer 123.

The pixels 10 may include microlenses. The microlenses can be arranged so as to constitute a surface of the imaging device 100. One microlens or two or more microlenses may be arranged per pixel 10. Each microlens may be arranged so as to concentrate light into a region where the first pixel electrode 13 and the second pixel electrode 14 overlap each other when the imaging device 100 is viewed in plan view.

Each pixel 10 further includes a plurality of plugs. The plugs extend in the normal direction of the semiconductor substrate 1. The plugs include a first plug 31, a second plug 32, and a third plug 33. The first plug 31 provides electrical connection between the semiconductor substrate 1 and the first pixel electrode 13. The second plug 32 provides electrical connection between the semiconductor substrate 1 and the second pixel electrode 14. The third plug 33 provides electrical connection between the semiconductor substrate 1 and the third pixel electrode 15.

The first plug 31, the second plug 32, and the third plug 33 are made of electrically conductive material. Examples of the electrically conductive material include metal, metal oxide, metal nitride, and electrically conductive polysilicon.

The semiconductor substrate 1 has a plurality of charge accumulation regions. The charge accumulation regions may be portions of the pixels 10. Each charge accumulation region is an n-type or p-type impurity region. The charge accumulation regions include a first charge accumulation region 3, a second charge accumulation region 4, and a third charge accumulation region 5. The first plug 31 provides electrical connection between the first charge accumulation region 3 and the first pixel electrode 13. The second plug 32 provides electrical connection between the second charge accumulation region 4 and the second pixel electrode 14. The third plug 33 provides electrical connection between the third charge accumulation region 5 and the third pixel electrode 15.

The semiconductor substrate 1 may have a plurality of transistors for reading out and resetting charge accumulated in the first charge accumulation region 3, the second charge accumulation region 4, and the third charge accumulation region 5.

The pixel electrodes 13, 14, and 15 may be electrically connected to the charge accumulation regions 3, 4, and 5 through plugs that penetrate the semiconductor substrate 1 and wiring layers at a lower side of the semiconductor substrate 1.

Herein, the "upper side" and "lower side" are defined based on the traveling direction of light. The "upper side" is a side that is closer to a light-incidence surface, and the "lower side" is a side that is farther from the light-incidence surface.

When the imaging device 100 is illuminated with light, the first photoelectric conversion layer 121, the second photoelectric conversion layer 122, and the third photoelectric conversion layer 123 generate electron-hole pairs.

For example, when a voltage is applied between the first counter electrode 17 and the first pixel electrode 13 so that a potential of the first counter electrode 17 exceeds a potential of the first pixel electrode 13, holes, which are positive charge, are gathered at the first pixel electrode 13, and electrons, which are negative charge, are gathered at the first counter electrode 17. The holes gathered at the first pixel electrode 13 are accumulated in the first plug 31 and the first charge accumulation region 3.

When a voltage is applied between the second counter electrode 18 and the second pixel electrode 14 so that a potential of the second counter electrode 18 exceeds a potential of the second pixel electrode 14, holes, which are positive charge, are gathered at the second pixel electrode 14, and electrons, which are negative charge, are gathered at the second counter electrode 18. The holes that are gathered at the second pixel electrode 14 are accumulated in the second plug 32 and the second charge accumulation region 4.

When a voltage is applied between the second counter electrode 18 and the third pixel electrode 15 so that a potential of the second counter electrode 18 exceeds a potential of the third pixel electrode 15, holes, which are positive charge, are gathered at the third pixel electrode 15, and electrons, which are negative charge, are gathered at the second counter electrode 18. The holes that are gathered at the third pixel electrode 15 are accumulated in the third plug 33 and the third charge accumulation region 5.

A blocking layer that prevents flowing of charge into each pixel electrode during dark time may be provided between the pixel electrode and the corresponding photoelectric conversion layer.

The imaging device 100 in the present embodiment has a multi-layer structure. The "multi-layer" means that a plurality of photoelectric conversion layers lies in the normal direction of the semiconductor substrate 1. Since the multi-layer structure makes it possible to ensure a sufficient area of the pixel electrodes, it is advantageous to enhance the sensitivity of the pixels. In the present embodiment, since three photoelectric conversion layers, that is, the first photoelectric conversion layer 121, the second photoelectric conversion layer 122, and the third photoelectric conversion layer 123, are provided, the imaging device 100 can be said to have a three-layer structure. The first photoelectric conversion layer 121, the second photoelectric conversion layer 122, and the third photoelectric conversion layer 123 typically have photoelectric conversion characteristics that are different from each other.

According to the imaging device 100 having the three-layer structure, the three photoelectric conversion layers may include a photoelectric conversion layer having sensitivity to blue light, a photoelectric conversion layer having sensitivity to green light, and a photoelectric conversion layer having sensitivity to red light. Accordingly, the three-layer structure is suitable for forming full-color images.

The following description will be given of an arrangement of the plugs for suppressing crosstalk between the plugs. Herein, the plugs are denoted by two, three, or four symbols that are different from one another.

The description in the present embodiment can be applied to not only the imaging device 100 having the three-layer structure but also an imaging device having a two-layer structure. The third photoelectric conversion layer 123, the third pixel electrodes 15, and the third plugs 33 may be arbitrary elements. When the description in the present embodiment is applied to an imaging device having a two-layer structure, descriptions of the third photoelectric conversion layer 123, the third pixel electrode 15, and the third plug 33 are excluded.

Figure 3A:
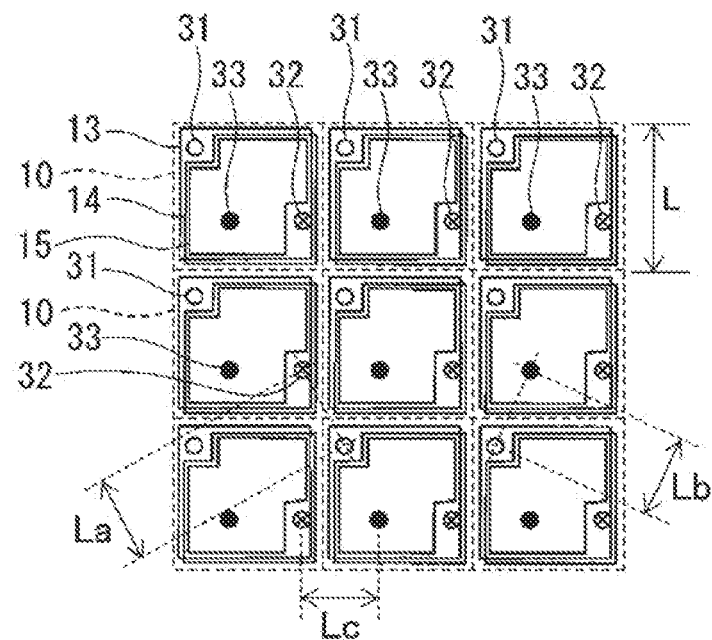
FIG. 3A is a diagram illustrating an arrangement of pixel electrodes and plugs when the imaging device according to the first embodiment is viewed in a normal direction of a semiconductor substrate.

FIG. 3A illustrates an arrangement of the first pixel electrodes 13, the second pixel electrodes 14, the third pixel electrodes 15, the first plugs 31, the second plugs 32, and the third plugs 33 when the imaging device 100 is viewed in the normal direction of the semiconductor substrate 1. In other words, FIG. 3A is a projection view of the first pixel electrodes 13, the second pixel electrodes 14, the third pixel electrodes 15, the first plugs 31, the second plugs 32, and the third plugs 33 projected onto a plane orthogonal to the normal direction of the semiconductor substrate 1.

Herein, viewing the imaging device 100 in the normal direction of the semiconductor substrate 1 is synonymous with viewing the imaging device 100 in plan view.

The pixel electrodes in a lower layer are notched, as appropriate, so as to avoid the plugs in an upper layer. Specifically, each first pixel electrode 13 is rectangle. Each second pixel electrode 14 has a notch for passage of the corresponding first plug 31. Each third pixel electrode 15 has a notch for passage of the corresponding first plug 31 and a notch for passage of the corresponding second plug 32. According to this configuration, it is possible to maximize the areas of the second pixel electrode 14 and the third pixel electrode 15, while ensuring the spaces for passage of the first plug 31 and the second plug 32. This allows the individual pixel electrodes to have approximately the same sensitivity. In the present embodiment, the area of the first pixel electrode 13 is larger than the area of the second pixel electrode 14. The area of the second pixel electrode 14 is larger than the area of the third pixel electrode 15. The first pixel electrode 13 located in the highest layer does not have a notch. The first pixel electrode 13 has, for example, a square shape.

In the pixels 10 that are adjacent to each other, a distance Lc between the closest plugs is larger than or equal to one-half of a pixel pitch L, when the imaging device 100 is viewed in the normal direction of the semiconductor substrate 1. The upper limit of the distance Lc is not particularly limited. The distance Lc is smaller than the pixel pitch L. When one pixel 10 arbitrary selected from two or more pixels 10 is defined as a first pixel, and two or more pixels 10 that are adjacent to the first pixel are defined as a plurality of second pixels, the distance between the closest plugs in the first pixel and the plurality of second pixels is larger than or equal to one-half of the pixel pitch L.

As illustrated in FIG. 3A, in the pixels 10 that are adjacent to each other, the closest plugs are the second plug 32 and the third plug 33. The distance between the second plug 32 and the third plug 33 is represented by the distance Lc. The "distance between the plugs" refers to the distance between the center of one plug and the center of another plug. The shape of each plug in plan view is not limited to a circular shape. Accordingly, the "center of one plug" refers to the barycenter of the plug. The "pixel pitch" refers to a repetition cycle of the pixels 10. The pixel pitch L corresponds to the distance between the centers of two adjacent pixels 10. The repetition cycle of the pixels 10 matches the distance between particular plugs. For example, the distance between one arbitrary first plug 31 and another first plug 31 that is the closest to the arbitrary first plug 31 is equal to the pixel pitch L. The position of the second plug 32 and the position of the third plug 33 may also be interchanged.

According to the present embodiment, since the plugs in the pixels 10 that are adjacent to each other are sufficiently away from each other, it is possible to suppress crosstalk between the plugs in the pixels 10 that are adjacent to each other. As a result, it is possible to suppress color mixing in an image to be acquired.

A wiring layer may be provided between the semiconductor substrate 1 and the third photoelectric conversion layer 123. When the wiring layer is provided, the first plug 31, the second plug 32, and the third plug 33 may be electrically connected to the first charge accumulation region 3, the second charge accumulation region 4, and the third charge accumulation region 5, respectively, via the wiring layer. When the first plug 31, the second plug 32, and the third plug 33 are connected to the first charge accumulation region 3, the second charge accumulation region 4, and the third charge accumulation region 5, respectively, via the wiring layer, the "distance between the plugs" means the distance between portions of the plugs which connect the corresponding pixel electrodes and the wiring layer.

In the pixels 10 that are adjacent to each other, a distance La between the first plug 31 and the second plug 32 is larger than or equal to one-half of the pixel pitch L and is, for example, larger than the distance Lc. In the pixels 10 that are adjacent to each other, a distance Lb between the first plug 31 and the third plug 33 is larger than or equal to one-half of the pixel pitch L and is, for example, larger than the distance Lc. That is, in the pixels 10 that are adjacent to each other, a sufficient distance is ensured between the first plug 31 and the second plug 32 or the third plug 33. The first plug 31 is longer than the second plug 32 and is longer than the third plug 33. The first plug 31 is the longest plug and is susceptible to crosstalk. Ensuring a sufficient distance between the first plug 31 and the second plug 32 or the third plug 33 can maximize the advantage of suppressing crosstalk.

However, the position of the first plug 31 and the position of the second plug 32 may be interchanged. The position of the first plug 31 and the position of the third plug 33 may be interchanged. That is, in the pixels 10 that are adjacent to each other, the closest plugs may be the first plug 31 and the third plug 33 or may be the first plug 31 and the second plug 32.

The distance La between the first plug 31 and the second plug 32 in the pixels 10 that are adjacent to each other may be larger than the distance Lb between the first plug 31 and the third plug 33 in the pixels 10 that are adjacent to each other.

In the imaging device 100 in the present embodiment, eight pixels 10 are adjacent to one particular pixel 10, except for cases in which the particular pixel 10 is located at an outermost periphery of the imaging device 100. This also applies to other embodiments.

Figure 3B:
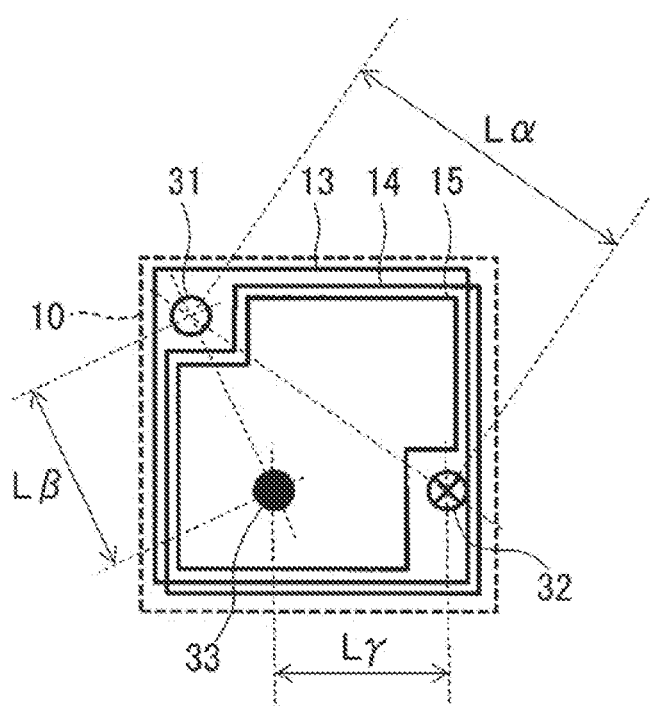
FIG. 3B is a diagram illustrating an arrangement of the pixel electrodes and the plugs in one particular pixel.

FIG. 3B illustrates an arrangement of the first pixel electrode 13, the second pixel electrode 14, the third pixel electrode 15, the first plug 31, the second plug 32, and the third plug 33 in one particular pixel 10 in the imaging device 100. In the present embodiment, a distance La between the first plug 31 and the second plug 32 in the pixel 10 is larger than or equal to one-half of the pixel pitch L. According to this configuration, it is possible to further suppress crosstalk between the plugs in each pixel 10. As a result, it is possible to suppress color mixing in an image to be acquired.

In the present embodiment, in addition, a distance Lβ between the first plug 31 and the third plug 33 in the pixel 10 is larger than or equal to one-half of the pixel pitch L. According to this configuration, it is possible to further suppress crosstalk between the plugs in each pixel 10. As a result, it is possible to suppress color mixing in an image to be acquired.

In the present embodiment, in addition, a distance Lγ between the second plug 32 and the third plug 33 in each pixel 10 is larger than or equal to one-half of the pixel pitch L. According to this configuration, it is possible to further suppress crosstalk between the plugs in each pixel 10. As a result, it is possible to suppress color mixing in an image to be acquired.

The first plug 31 is the longest plug, and the second plug 32 is longer than the third plug 33. Thus, influences of crosstalk between the first plug 31 and the second plug 32 are large. When the plugs are arranged so as to satisfy relationships Lα>Lβ and Lα>Lγ, it is possible to more effectively suppress the crosstalk.

A shield electrode maintained at a constant potential may be provided between the pixels 10 that are adjacent to each other. The shield electrode makes it possible to further suppress crosstalk between the plugs in the pixels 10 that are adjacent to each other.

The first charge accumulation region 3 can be arranged at a position that overlaps the first plug 31 in the normal direction of the semiconductor substrate 1. Similarly, the second charge accumulation region 4 can be arranged at a position that overlaps the second plug 32. The third charge accumulation region 5 can be arranged at a position that overlaps the third plug 33. According to such a configuration, it is possible to suppress crosstalk due to coupling between the charge accumulation regions.

First Modification

Figure 4A:
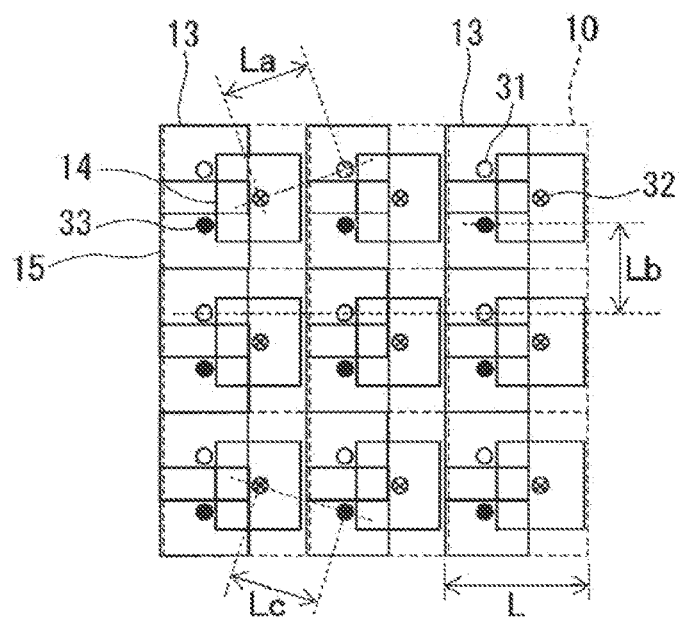
FIG. 4A is a diagram illustrating an arrangement of the pixel electrodes and the plugs according to a first modification.
Figure 4B:
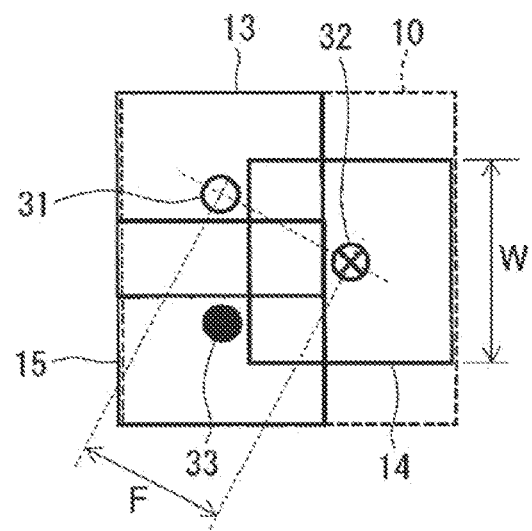
FIG. 4B is a diagram illustrating an arrangement of the pixel electrodes and the plugs in one particular pixel in the first modification.

FIG. 4A illustrates an arrangement of the first pixel electrodes 13, the second pixel electrodes 14, the third pixel electrodes 15, the first plugs 31, the second plugs 32, and the third plugs 33 according to a first modification. FIG. 4B illustrates an arrangement of the pixel electrodes and the plugs in one particular pixel in the first modification. In this modification, in the pixels 10 that are adjacent to each other, the distance Lc between the closest plugs is larger than or equal to one-half of the pixel pitch L. In the pixels 10 that are adjacent to each other, the closest plugs are the second plug 32 and the third plug 33. The distance between the second plug 32 and the third plug 33 is represented by the distance Lc. In the pixels 10 that are adjacent to each other, the distance La between the first plug 31 and the second plug 32 is equal to the distance Lc. That is, in the pixels 10 that are adjacent to each other, the distance La is also the distance between the closest plugs. In the pixels 10 that are adjacent to each other, the distance Lb between the first plug 31 and the third plug 33 is also larger than or equal to one-half of the pixel pitch L.

As illustrated in FIG. 4B, in this modification, the first pixel electrode 13 and the second pixel electrode 14 are arranged displaced from each other by one-half or more of a length W of one side of the second pixel electrode 14. In other words, a distance F between the first plug 31 and the second plug 32 is larger than or equal to W/2. The position of the barycenter of the first pixel electrode 13 and the position of the barycenter of the second pixel electrode 14 are displaced from each other. According to this configuration, crosstalk between the plugs or crosstalk between the charge accumulation regions can be suppressed without provision of notches or penetrating holes in the second photoelectric conversion layer 122.

Specifically, each first pixel electrode 13 has a square shape in plan view. The first plug 31 is arranged in a center region of the first pixel electrode 13. Each second pixel electrode 14 has a square shape in plan view. The second plug 32 is arranged in a center region of the second pixel electrode 14. The positional relationship between the first pixel electrode 13 and the second pixel electrode 14 is determined so that the first plug 31 passes outside the range of the second pixel electrode 14. According to this configuration, a penetrating hole for passage of the first plug 31 does not have to be provided in the second pixel electrode 14. The "center region of the pixel electrode" means a region having a certain range including the barycenter of the pixel electrode when the pixel electrode is viewed in plan view. Specifically, when the pixel electrode has a generally rectangular shape in plan view, the pixel electrode is divided into nine rectangular regions so that the areas of the respective divided regions are equal to each other. Of the nine rectangular regions, the region including the barycenter of the pixel electrode is the center region. When the pixel electrode has a notch or the like, the smallest quadrangular shape surrounding the pixel electrode can be divided into nine regions. The barycenter of the pixel electrode can be the barycenter of the smallest quadrangular shape surrounding the pixel electrode.

The first plug 31 may be arranged at a center of the first pixel electrode 13. In other words, when the imaging device 100 is viewed in plan view, the center of the first pixel electrode 13 may overlap the first plug 31. The "center of the pixel electrode" can be the barycenter of the pixel electrode when the pixel electrode is viewed in plan view.

Herein, the "plan view" is synonymous with viewing the imaging device 100 in the normal direction of the semiconductor substrate 1.

The third pixel electrode 15 has a square shape in plan view, as in the first pixel electrode 13 and the second pixel electrode 14. The third plug 33 is arranged in a center region of the third pixel electrode 15. The positional relationship of the first pixel electrode 13, the second pixel electrode 14, and the third pixel electrode 15 is determined so that the first plug 31 and the second plug 32 pass outside the range of the third pixel electrode 15. According to this configuration, penetrating holes for passage of the first plug 31 and the second plug 32 do not have to be provided in the third pixel electrode 15. The first plug 31, the second plug 32, and the third plug 33 are arranged at respective vertices of a regular triangle. The distance between the first plug 31 and the third plug 33 is also equal to the distance F. The distance between the second plug 32 and the third plug 33 is also equal to the distance F.

The third plug 33 may also be arranged at the center of the third pixel electrode 15. In other words, when the imaging device 100 is viewed in plan view, the center of the third pixel electrode 15 may overlap the third plug 33.

The first pixel electrode 13 and third pixel electrode 14 are arranged displaced from each other by one-half or more of the length W of one side of the second pixel electrode 14. The second pixel electrode 14 and the third pixel electrode 15 are arranged displaced from each other by one-half or more of the length W of one side of the second pixel electrode 14. The position of the barycenter of the first pixel electrode 13, the position of the barycenter of the second pixel electrode 14, and the position of the barycenter of the third pixel electrode 15 are displaced from one another.

Figure 4C:
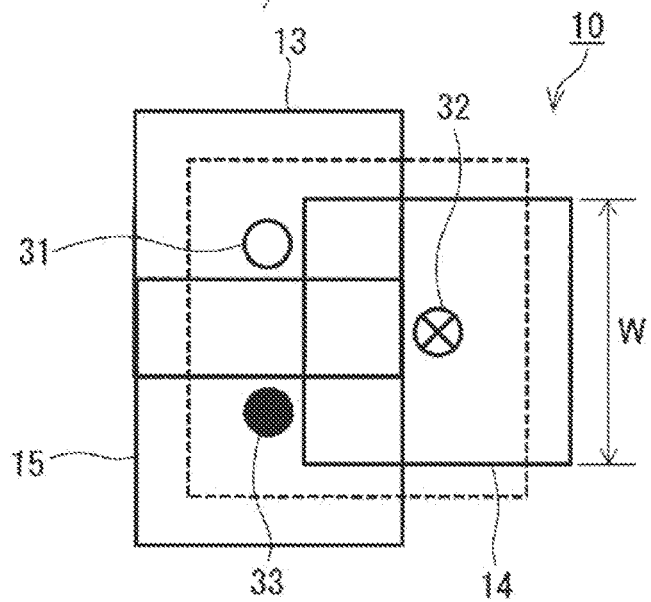
FIG. 4C is a diagram illustrating another arrangement of the pixel electrodes and the plugs in one particular pixel in the first modification.

FIG. 4C illustrates another arrangement of the pixel electrodes and the plugs in one particular pixel in the first modification. In the example illustrated in FIG. 4C, the first pixel electrode 13 and the second pixel electrode 14 are arranged at positions that are also displaced from each other by one-half or more of the length W of one side of the second pixel electrode 14. In other words, the distance F between the first plug 31 and the second plug 32 is larger than or equal to W/2.

In the normal direction of the semiconductor substrate 1, the pixel electrode in the upper layer in one particular pixel 10 overlaps the pixel electrode in the lower layer in another pixel 10 that is adjacent thereto. According to the example illustrated in FIG. 4C, it is possible to increase the area of each pixel electrode.

Second Modification

Figure 5A:
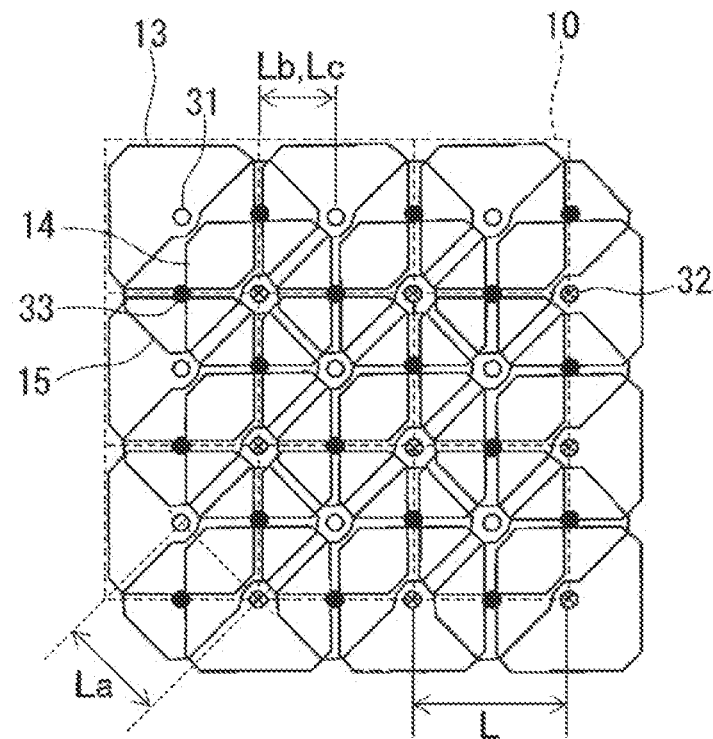
FIG. 5A is a diagram illustrating an arrangement of the pixel electrodes and the plugs according to a second modification.
Figure 5B:
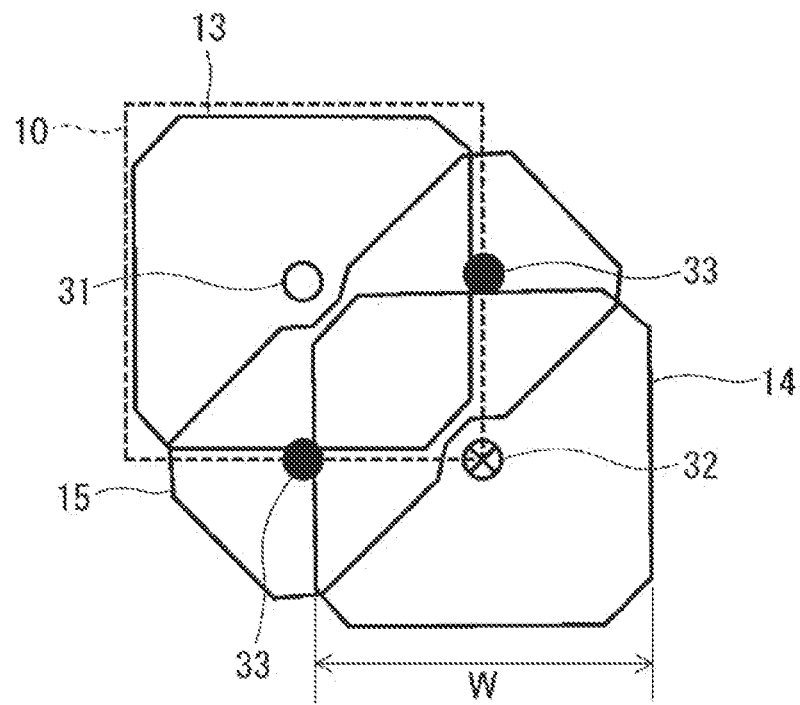
FIG. 5B is a diagram illustrating an arrangement of the pixel electrode and the plugs in one particular pixel in the second modification.

FIG. 5A illustrates an arrangement of the first pixel electrodes 13, the second pixel electrodes 14, the third pixel electrodes 15, the first plugs 31, the second plugs 32, and the third plugs 33 according to a second modification. FIG. 5B illustrates an arrangement of the pixel electrodes and the plugs in one particular pixel in the second modification. According to this modification, the distance between the closest plugs in the pixels 10 that are adjacent to each other is larger than or equal to one-half of the pixel pitch L. According to this modification, the distance between the plugs in the pixels 10 that are adjacent to each other is equal to L/2. The closest plugs in the pixels 10 that are adjacent to each other are the first plug 31 and the third plug 33 or the second plug 32 and the third plug 33. The distance Lb between the first plug 31 and the third plug 33 in the pixels 10 that are adjacent to each other is equal to L/2. The distance Lc between the second plug 32 and the third plug 33 in the pixels 10 that are adjacent to each other is equal to L/2. The distance La between the first plug 31 and the second plug 32 is equal to $L(\frac{1}{2})^{1/2}$.

As illustrated in FIG. 5B, in this modification, the first pixel electrode 13 and the second pixel electrode 14 are also arranged at positions that are displaced from each other by one-half or more of the length W of one side of the second pixel electrode 14. In other words, the distance F between the first plug 31 and the second plug 32 is larger than or equal to W/2. The distance F is equal to $W(\frac{1}{2})^{1/2}$. The distance between the second plug 32 and the third plug 33 is equal to W/2.

Two third plugs 33 are connected to the third pixel electrode 15. The third pixel electrode 15 has a generally rectangular shape having long sides and short sides. Each long side extends in directions that are orthogonal to a straight line that connects the first plug 31 and the second plug 32. When the imaging device 100 is viewed in plan view, the first plug 31, the second plug 32, and the third plugs 33 are located on grid points of a square grid. The arrangement of the first pixel electrode 13, the second pixel electrode 14, the third pixel electrode 15, the first plug 31, the second plug 32, and the third plugs 33 is determined so that the plugs in the upper layer avoid the pixel electrode in the lower layer. The first plug 31 passes outside the range of the second pixel electrode 14 and the third pixel electrode 15. The second plug 32 passes outside the range of the third pixel electrode 15.

The second pixel electrode 14 and the third pixel electrode 15 have notches for avoiding the plugs in the upper layer. Since the first pixel electrode 13 is a pixel electrode located at the uppermost position, it may or may not have notches.

Third Modification

Figure 6A:
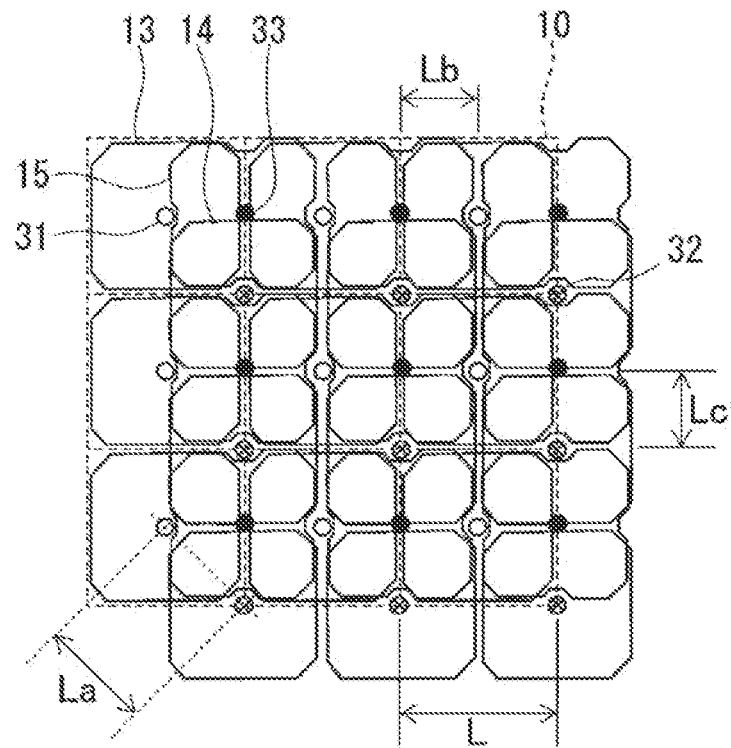
FIG. 6A is a diagram illustrating an arrangement of the pixel electrodes and the plugs according to a third modification.
Figure 6B:
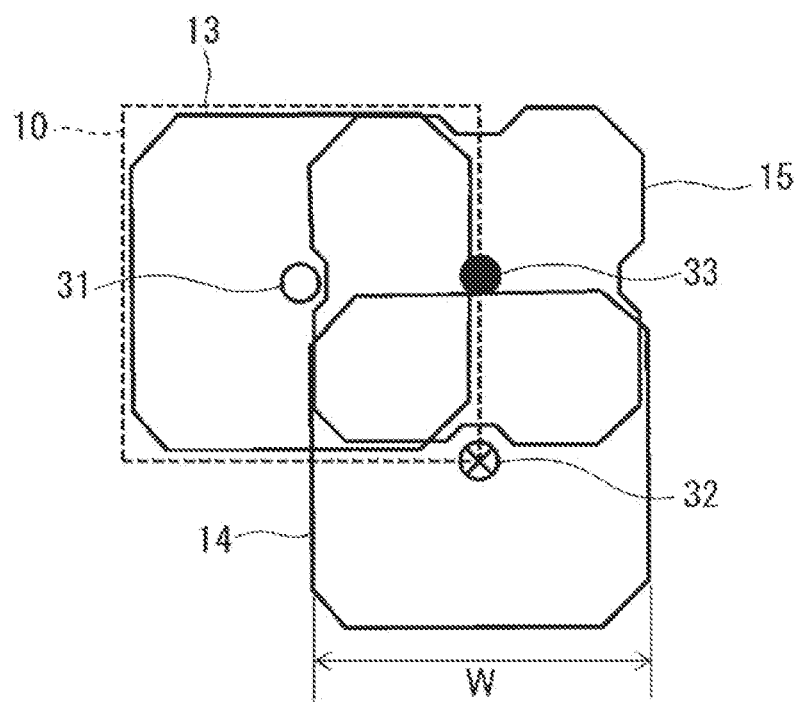
FIG. 6B is a diagram illustrating an arrangement of the pixel electrodes and the plugs in one particular pixel in the third modification.

FIG. 6A illustrates an arrangement of the first pixel electrodes 13, the second pixel electrodes 14, the third pixel electrodes 15, the first plugs 31, the second plugs 32, and the third plugs 33 according to a third modification. FIG. 6B illustrates an arrangement of the pixel electrodes and the plugs in one particular pixel in the third modification. The first pixel electrodes 13, the second pixel electrodes 14, the third pixel electrodes 15, the first plugs 31, the second plugs 32, and the third plugs 33 in this modification are substantially the same as those in the second modification, except that each third pixel electrode 15 has a square shape instead of a rectangular shape. Each third pixel electrode 15 is provided with notches for avoiding the first plug 31 and the second plug 32. In this modification, the distance between the closest plugs in the pixels 10 that are adjacent to each other is also larger than or equal to one-half of the pixel pitch L. The closest plugs in the pixels 10 that are adjacent to each other are the first plug 31 and the third plug 33 or the second plug 32 and the third plug 33.

Fourth Modification

Figure 7A:
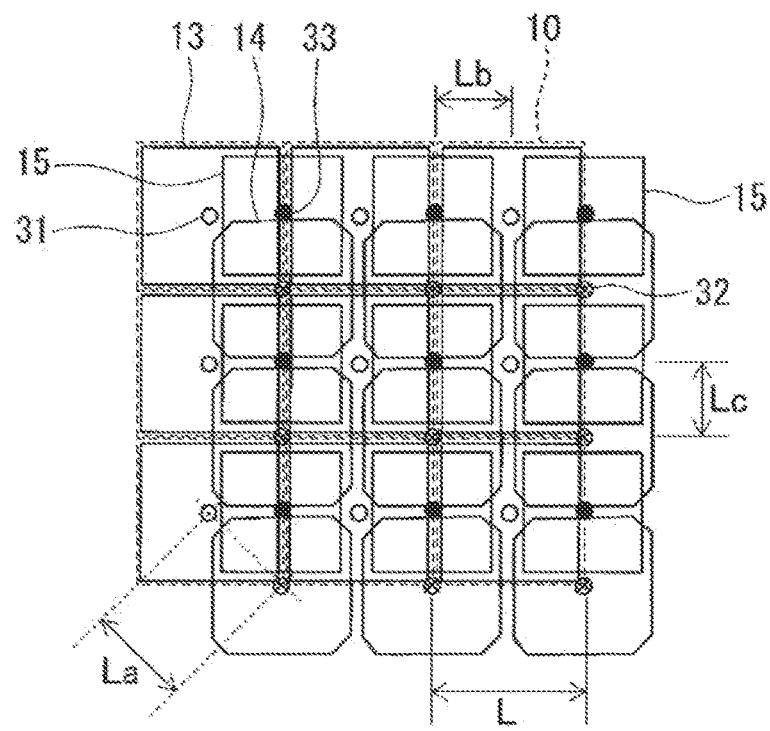
FIG. 7A is a diagram illustrating an arrangement of the pixel electrodes and the plugs according to a fourth modification.
Figure 7B:
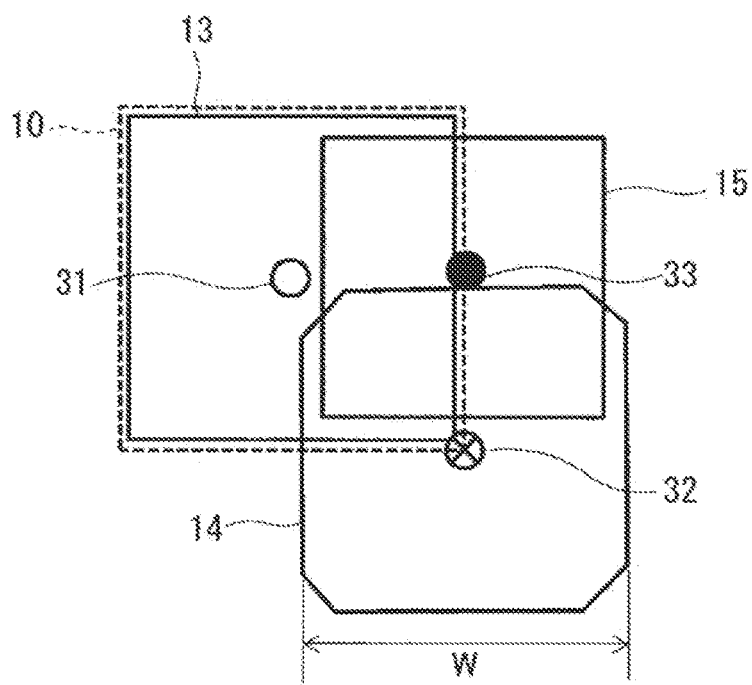
FIG. 7B is a diagram illustrating an arrangement of the pixel electrodes and the plugs in one particular pixel in the fourth modification.

FIG. 7A illustrates an arrangement of the first pixel electrodes 13, the second pixel electrodes 14, the third pixel electrodes 15, the first plugs 31, the second plugs 32, and the third plugs 33 according to a fourth modification. FIG. 7B illustrates an arrangement of the pixel electrodes and the plugs in one particular pixel in the second modification. The arrangement of the first pixel electrodes 13, the second pixel electrodes 14, the third pixel electrodes 15, the first plugs 31, the second plugs 32, and the third plugs 33 in this modification are substantially the same as those in the third modification, except that each third pixel electrode 15 has a square shape having no notches. The area of each first pixel electrode 13 is larger than the area of each second pixel electrode 14 and is larger than the area of each third pixel electrode 15. In this modification, the distance between the closest plugs in the pixels 10 that are adjacent to each other is also larger than or equal to one-half of the pixel pitch L. The closest plugs in the pixels 10 that are adjacent to each other are the first plug 31 and the third plug 33 or the second plug 32 and the third plug 33.

Second Embodiment

Figure 8A:
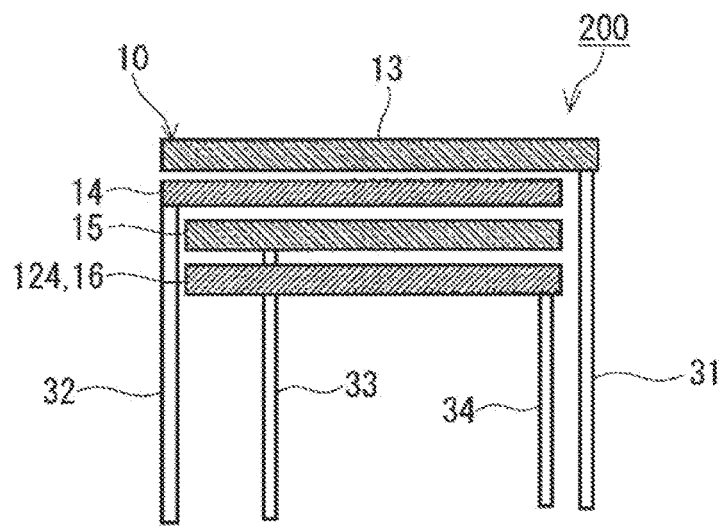
FIG. 8A is a diagram illustrating an imaging device according to a second embodiment of the present disclosure.

FIG. 8A illustrates a configuration of an imaging device 200 according to a second embodiment of the present disclosure. The imaging device 200 has a four-layer structure. The imaging device 200 has a fourth photoelectric conversion layer 124, a fourth pixel electrode 16, and a fourth plug 34, in addition to the configuration of the imaging device 100 in the first embodiment.

In the normal direction of the semiconductor substrate 1, the fourth photoelectric conversion layer 124 is arranged, for example, between the third photoelectric conversion layer 123 and the semiconductor substrate 1. The fourth pixel electrode 16 is electrically connected to the fourth photoelectric conversion layer 124 to collect charge corresponding to light in a fourth wavelength range. The fourth wavelength range is, for example, the wavelength range of near infrared light. The fourth photoelectric conversion layer 124 is made of material having sensitivity to near infrared light. The fourth plug 34 provides electrical connection between the semiconductor substrate 1 and the corresponding fourth pixel electrode 16.

Visible light is absorbed by the first photoelectric conversion layer 121, the second photoelectric conversion layer 122, and the third photoelectric conversion layer 123 in the upper layers. Since visible light does not reach the fourth photoelectric conversion layer 124, which has sensitivity to near infrared light, the fourth photoelectric conversion layer 124 makes it possible to acquire images based on near infrared light.

Figure 8B:
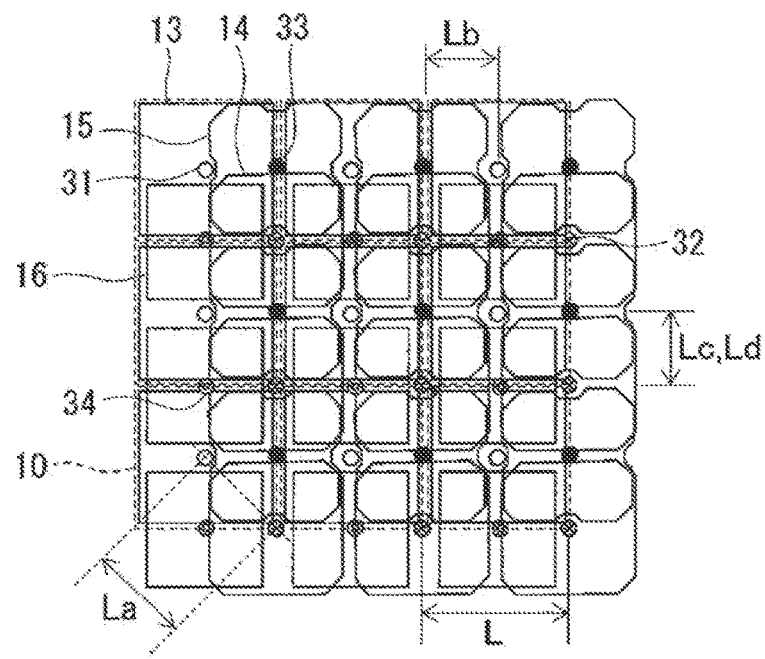
FIG. 8B is a diagram illustrating an arrangement of the pixel electrodes and the plugs when the imaging device according to the second embodiment is viewed in the normal direction of the semiconductor substrate.
Figure 8C:
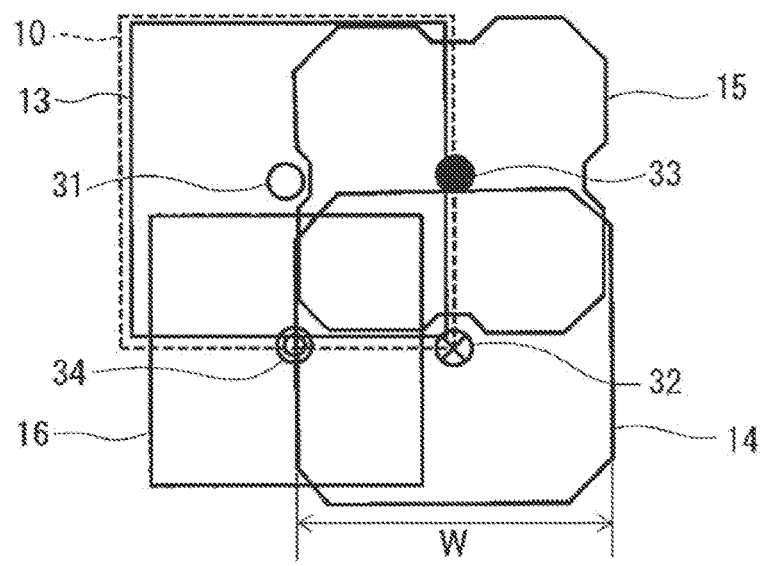
FIG. 8C is a diagram illustrating an arrangement of the pixel electrodes and the plugs in one particular pixel.

FIG. 8B illustrates an arrangement of the first pixel electrodes 13, the second pixel electrodes 14, the third pixel electrodes 15, the fourth pixel electrodes 16, the first plugs 31, the second plugs 32, the third plugs 33, and the fourth plugs 34 when the imaging device 200 is viewed in the normal direction of the semiconductor substrate 1. FIG. 8C illustrates an arrangement of the first pixel electrode 13, the second pixel electrode 14, the third pixel electrode 15, the fourth pixel electrode 16, the first plug 31, the second plug 32, the third plug 33, and the fourth plug 34 in one particular pixel 10.

When the fourth pixel electrodes 16 and the fourth plugs 34 are added to the arrangement of the first pixel electrodes 13, the second pixel electrodes 14, the third pixel electrodes 15, the first plugs 31, the second plugs 32, and the third plugs 33 according to the third modification described above, the arrangement of the first pixel electrodes 13, the second pixel electrodes 14, the third pixel electrodes 15, the fourth pixel electrodes 16, the first plugs 31, the second plugs 32, the third plugs 33, and the fourth plugs 34 in the imaging device 200 in the present embodiment is obtained.

In the present embodiment, the distance between the closest plugs in the pixels 10 that are adjacent to each other is also larger than or equal to the pixel pitch L. According to the present embodiment, the distance between the plugs in the pixels 10 that are adjacent to each other is equal to L/2. The closest plugs in the pixels 10 that are adjacent to each other are the first plug 31 and the third plug 33, the second plug 32 and the third plug 33, or the first plug 31 and the fourth plug 34. The distance Lb between the first plug 31 and the third plug 33 in the pixels 10 that are adjacent to each other is equal to L/2. The distance Lc between the second plug 32 and the third plug 33 in the pixels 10 that are adjacent to each other is equal to L/2. A distance Ld between the first plug 31 and the fourth plug 34 in the pixels 10 that are adjacent to each other is equal to L/2. The distance La between the first plug 31 and the second plug 32 is equal to $L(½)^{1/2}$.

When the imaging device 200 is viewed in plan view, the first plug 31, the second plug 32, the third plug 33, and the fourth plug 34 are located on grid points of a square grid. The arrangement of the first pixel electrode 13, the second pixel electrode 14, the third pixel electrode 15, the fourth pixel electrode 16, the first plug 31, the second plug 32, the third plug 33, and the fourth plug 34 is determined so that the plugs in the upper layer avoid the pixel electrodes in the lower layer. The first plug 31 passes outside the range of the second pixel electrode 14, the third pixel electrode 15, and the fourth pixel electrode 16. The second plug 32 passes outside the range of the third pixel electrode 15 and the fourth pixel electrode 16. The third plug 33 passes outside the range of the fourth pixel electrode 16.

Fifth Modification

Figure 9A:
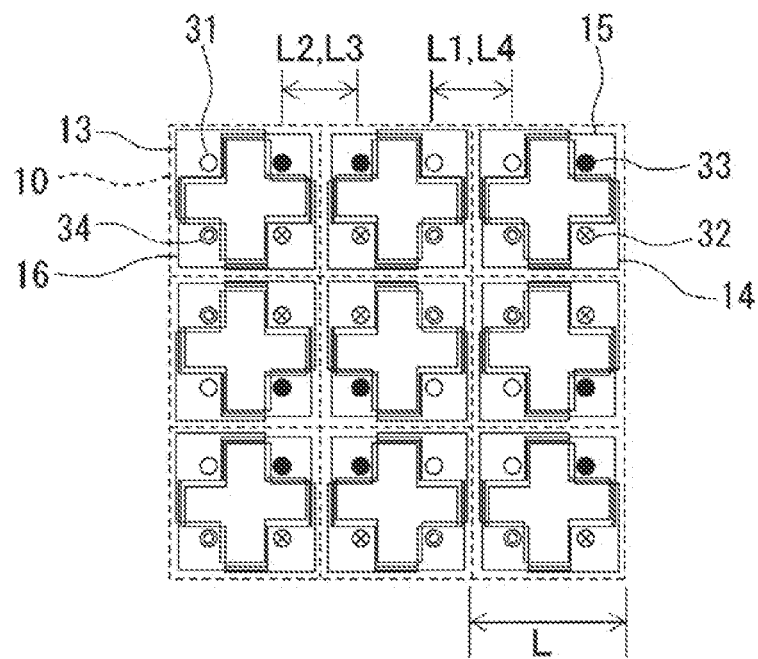
FIG. 9A is a diagram illustrating an arrangement of the pixel electrodes and the plugs according to a fifth modification.
Figure 9B:
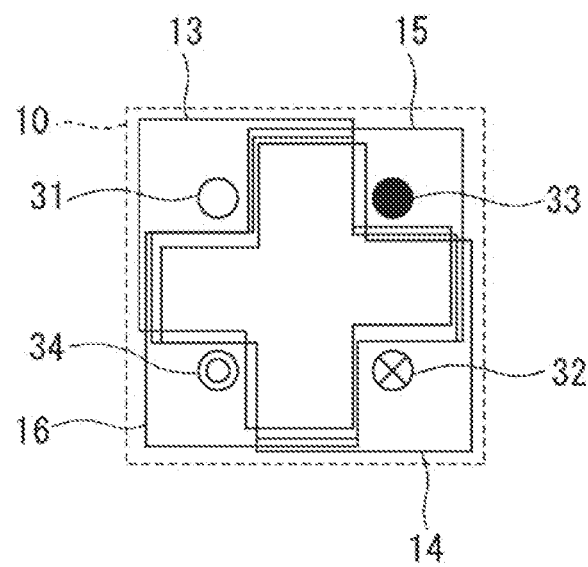
FIG. 9B is a diagram illustrating the pixel electrodes and the plugs in one particular pixel in the fifth modification.

FIG. 9A illustrates an arrangement of the first pixel electrodes 13, the second pixel electrodes 14, the third pixel electrodes 15, the fourth pixel electrodes 16, the first plugs 31, the second plugs 32, the third plugs 33, and the fourth plugs 34 according to a fifth modification. FIG. 9B illustrates an arrangement of the first pixel electrode 13, the second pixel electrode 14, the third pixel electrode 15, the fourth pixel electrode 16, the first plug 31, the second plug 32, the third plug 33, and the fourth plug 34 in one particular pixel 10 in the fifth modification.

In this modification, the distance between the closest plugs in the pixels 10 that are adjacent to each other is also larger than or equal to one-half of the pixel pitch L. According to this modification, the distance between the plugs in the pixels 10 that are adjacent to each other is equal to L/2. The closest plugs in the pixels 10 that are adjacent to each other are the first plugs 31, the second plugs 32, the third plugs 33, or the fourth plugs 34. In the pixels 10 that are adjacent to each other, a distance L1 between the first plug 31 and the first plug 31 is equal to a distance L2 between the second plug 32 and the second plug 32, is equal to a distance L3 between the third plug 33 and the third plug 33, and is equal to a distance L4 between the fourth plug 34 and the fourth plug 34. In other words, the reverse arrangement of the plurality of pixels 10 is determined so that a relationship as described above is satisfied in the pixels 10 that are adjacent to each other.

According to the configuration in this modification, the plugs that are the closest to each other in the pixels 10 that are adjacent to each other are the plugs for the same color. Thus, not only is crosstalk between the plugs suppressed, but also an advantage of suppressing color mixing is additionally obtained.

In this modification, the arrangement of the first pixel electrode 13, the second pixel electrode 14, the third pixel electrode 15, the fourth pixel electrode 16, the first plug 31, the second plug 32, the third plug 33, and the fourth plug 34 is also determined so that the plugs in the upper layer avoid the pixel electrodes in the lower layer. The first plug 31 passes outside the range of the second pixel electrode 14, the third pixel electrode 15, and the fourth pixel electrode 16. In other words, the second pixel electrode 14, the third pixel electrode 15, and the fourth pixel electrode 16 have notches for passage of the first plug 31. The second plug 32 passes outside the range of the third pixel electrode 15 and the fourth pixel electrode 16. In other words, the third pixel electrode 15 and the fourth pixel electrode 16 have notches for passage of the second plug 32. The third plug 33 passes outside the range of the fourth pixel electrode 16. In other words, the fourth pixel electrode 16 has a notch for passage of the third plug 33.

Third Embodiment

Figure 10A:
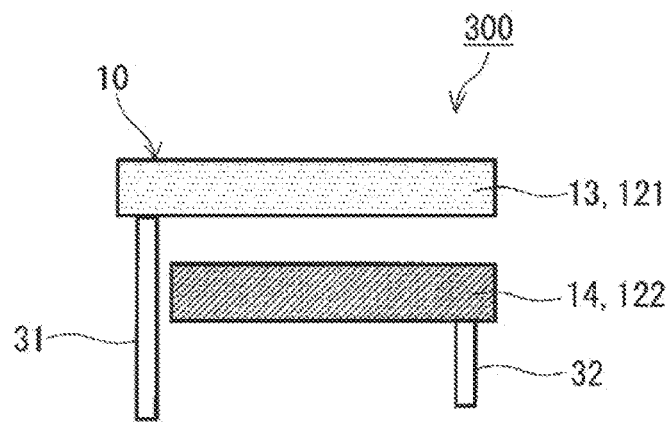
FIG. 10A is a diagram illustrating an imaging device according to a third embodiment of the present disclosure.

FIG. 10A illustrates a configuration of an imaging device 300 according to a third embodiment of the present disclosure. The imaging device 300 has a two-layer structure. The imaging device 300 has, for example, a configuration obtained by eliminating one set of the photoelectric conversion layer, the pixel electrode, and the plug from the imaging device 100 in the first embodiment.

The first photoelectric conversion layer 121 collects charge corresponding to light in the first wavelength range. The second photoelectric conversion layer 122 collects charge corresponding to light in the second wavelength range. The first wavelength range is, for example, the wavelength range of visible light. The first photoelectric conversion layer 121 can be made of photoelectric conversion material having sensitivity to visible light. When a color filter is used, a full-color image can be formed through acquisition of blue, green, and red information from the first photoelectric conversion layer 121. A monochrome image can also be acquired from the first photoelectric conversion layer 121. The second wavelength range is, for example, the wavelength range of near infrared light. The second photoelectric conversion layer 122 can be made of photoelectric conversion material having sensitivity to visible light. An image based on information on near infrared light can be formed from the second photoelectric conversion layer 122.

Figure 10B:
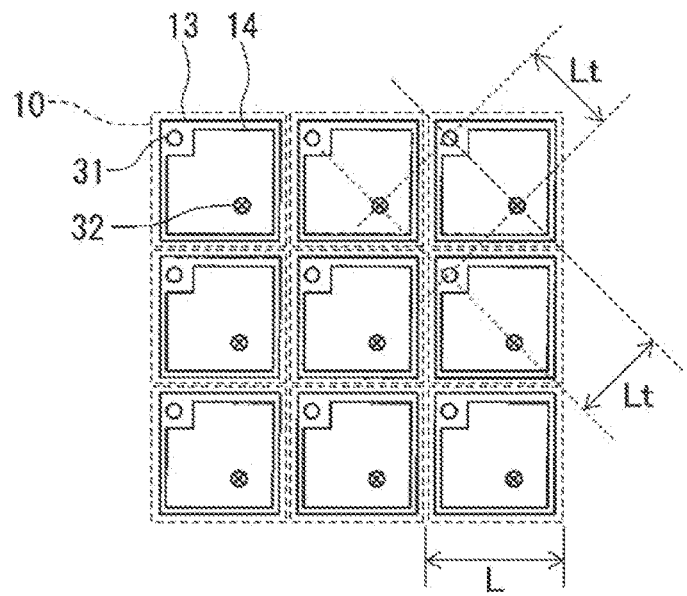
FIG. 10B is a diagram illustrating an arrangement of the pixel electrodes and the plugs when the imaging device according to the third embodiment is viewed in the normal direction of the semiconductor substrate.
Figure 10C:
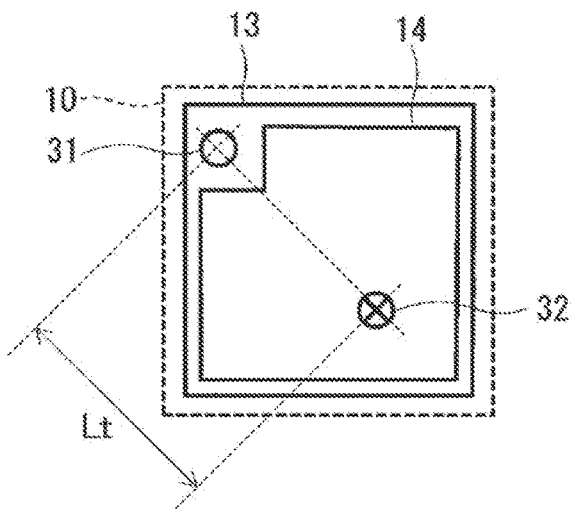
FIG. 10C is a diagram illustrating an arrangement of the pixel electrodes and the plugs in one particular pixel.

FIG. 10B illustrates an arrangement of the first pixel electrodes 13, the second pixel electrodes 14, the first plugs 31, and the second plugs 32 when the imaging device 300 is viewed in the normal direction of the semiconductor substrate 1. FIG. 10C illustrates an arrangement of the first pixel electrode 13, the second pixel electrode 14, the first plug 31, and the second plug 32 in one particular pixel 10.

In the present embodiment, the distance between the closest plugs in the pixels 10 that are adjacent to each other is also larger than or equal to one-half of the pixel pitch L. The closest plugs in the pixels 10 that are adjacent to each other are the first plug 31 and the second plug 32. In the present embodiment, every interval between the first plug 31 and the second plug 32 is a distance Lt. That is, the first plugs 31 and the second plugs 32 are arranged on grid points of a square grid whose one side has a length Lt. The distance Lt is larger than or equal to one-half of the pixel pitch L and is smaller than the pixel pitch L.

In the present embodiment, since the plugs are sufficiently away from each other, it is possible to suppress crosstalk between the plugs in the pixels 10 that are adjacent to each other. As a result, it is possible to suppress color mixing in an image to be acquired.

The first plug 31 and the second plug 32 may be arranged at diagonal corners. The first plug 31 and the second plug 32 may be arranged in the vicinity of a diagonal line of the first pixel electrode 13. The first plug 31 and the second plug 32 may be arranged on a diagonal line of the first pixel electrode 13. Such an arrangement makes it possible to more effectively suppress crosstalk. The "plugs are arranged on a diagonal line of the first pixel electrode 13" means that the plugs overlap a diagonal line of the smallest quadrangular shape surrounding the first pixel electrode 13, when the imaging device 100 is viewed in plan view.

Fourth Embodiment

FIG. 11A illustrates a cross section of an imaging device 400 according to a fourth embodiment. The imaging device 400 also has a two-layer structure. Each pixel 10 in the imaging device 400 further includes a photodiode PD instead of the third photoelectric conversion layer 123, the third pixel electrode 15, the third plug 33, and the third charge accumulation region 5 in the imaging device 100 described above with reference to FIG. 2.

The photodiode PD is provided at the semiconductor substrate 1. Each of the first pixel electrode 13 and the second pixel electrode 14 is light transmissive. A color filter 19r or a color filter 19b is provided between the photodiode PD and the second photoelectric conversion layer 122. Each of the photodiodes PD is covered by the color filter 19r or the color filter 19b. An insulating layer 25 is provided between the photodiode PD and the color filters 19r and 19b. The insulating layer 25 is made of insulating material, such as $SiO_2$. The insulating layer 9 lies between the second pixel electrode 14 and the color filters 19r and 19b. The insulating layer 9 serves as a planarization layer and can be made of a transparent resin, such as acrylic resin or epoxy resin. The imaging device 400 includes condensing lenses 21. Owing to the functions of the condensing lens 21, light can be effectively introduced into the photodiodes PD. The condensing lenses have functions that are similar to those of the above-described microlens.

The first photoelectric conversion layer 121 has sensitivity to, for example, the wavelength range of near infrared light. The first photoelectric conversion layer 121 can be created using photoelectric conversion material having sensitivity to the wavelength range of near infrared light. The second photoelectric conversion layer 122 has sensitivity to, for example, the wavelength range of green light. The second photoelectric conversion layer 122 can be created using photoelectric conversion material having sensitivity to the wavelength range of green light. The photodiode PD is, typically, a silicon photodiode. The color filter 19r is a filter for cutting red light. The color filter 19b is filter for cutting blue light.

Since the first photoelectric conversion layer 121 has sensitivity to the wavelength range of near infrared light, and the second photoelectric conversion layer 122 has sensitivity to the wavelength range of green light, red light and blue light reach the color filters 19r and 19b. Red light is cut by the color filter 19r, and only blue light is incident on the corresponding photodiode PD. Blue light is cut by the color filter 19b, and only red light is incident on the corresponding photodiode PD. Accordingly, the imaging device 400 can form near-infrared-light-based images and full-color images.

Figure 11B:
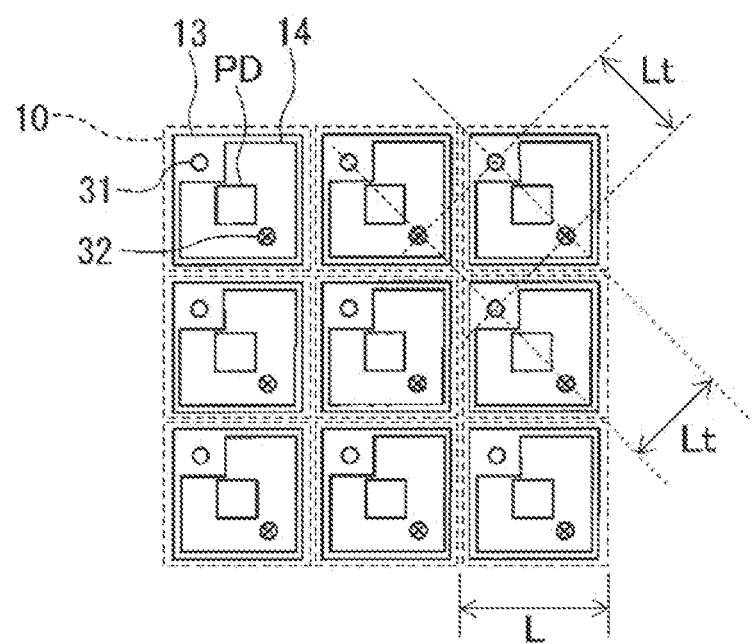
FIG. 11B is a diagram illustrating an arrangement of the pixel electrodes, the plugs, and photodiodes when the imaging device according to the fourth embodiment is viewed in the normal direction of the semiconductor substrate.

FIG. 11B illustrates an arrangement of the first pixel electrodes 13, the second pixel electrodes 14, the first plugs 31, the second plugs 32, and the photodiodes PD when the imaging device 400 is viewed in the normal direction of the semiconductor substrate 1. The first plugs 31 and the second plugs 32 in the imaging device 400 in the present embodiment employ, for example, the arrangement of the first plugs 31 and the second plugs 32 described above with reference to FIGS. 10A to 10C.

That is, the distance between the closest plugs in the pixels 10 that are adjacent to each other is larger than or equal to one-half of the pixel pitch L. The closest plugs in the pixels 10 that are adjacent to each other are the first plug 31 and the second plug 32. In the present embodiment, every interval between the plugs 31 and 32 is a distance Lt. That is, the first plugs 31 and the second plugs 32 are arranged on grid points of a square grid whose one side has a length Lt. The distance Lt is larger than or equal to one-half of the pixel pitch L and is smaller than the pixel pitch L.

In the present embodiment, since the plugs are sufficiently away from each other, it is possible to suppress crosstalk between the plugs in the pixels 10 that are adjacent to each other. As a result, it is possible to suppress color mixing in an image to be acquired.

Fifth Embodiment

Figure 12:
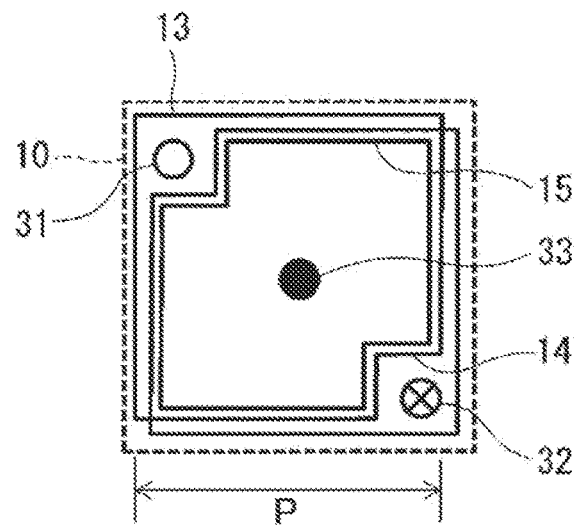
FIG. 12 is a diagram illustrating an arrangement of the pixel electrodes and the plugs in one particular pixel in an imaging device according to a fifth embodiment of the present disclosure.

FIG. 12 illustrates an arrangement of the first pixel electrode 13, the second pixel electrode 14, the third pixel electrode 15, the first plug 31, the second plug 32, and the third plug 33 in one particular pixel in an imaging device according to a fifth embodiment of the present disclosure. The imaging device in the present embodiment has a three-layer structure that is similar to that in the imaging device 100 in the first embodiment.

The first pixel electrode 13 has, for example, a square shape in plan view. Since the first photoelectric conversion layer 121 is a photoelectric conversion layer located at the uppermost position, the first pixel electrode 13 does not necessarily have to have notches for passage of the plugs. The second pixel electrode 14 and the third pixel electrode 15 have notches for passage of the first plug 31. The third pixel electrode 15 has a notch for passage of the second plug 32.

In the present embodiment, when viewed in the normal direction of the semiconductor substrate 1, the distance between the first plug 31 and the second plug 32 is larger than a long side P of the first pixel electrode 13. According to this configuration, crosstalk due to coupling between the first plug 31 and the second plug 32 is suppressed in each pixel 10. As a result, it is possible to reduce noise.

In the present embodiment, the first plug 31 and the second plug 32 are arranged at diagonal corners. The first plug 31 and the second plug 32 may be arranged in the vicinity of a diagonal line of the first pixel electrode 13. The first plug 31 and the second plug 32 may be arranged on a diagonal line of the first pixel electrode 13. Such an arrangement makes it possible to more effectively suppress crosstalk.

The third photoelectric conversion layer 123 is a photoelectric conversion layer located at the lowest position. Each third plug 33 is shorter than each first plug 31 and is shorter than each second plug 32. Influences of crosstalk between the third plug 33 and the other plugs are small. Hence, the third plugs 33 can be arranged at arbitrary positions. In the present embodiment, each third plug 33 is arranged in a center region of the third pixel electrode 15. According to this configuration, it is possible to ensure sufficient distances between the first charge accumulation region 3, the second charge accumulation region 4, and the third charge accumulation region 5. This makes it possible to suppress crosstalk between the charge accumulation regions and also makes it possible to suppress crosstalk between the charge accumulation region and the corresponding plug. Design freedom of the third charge accumulation regions 5 and transistors connected to the third plugs 33 also improves.

The third plug 33 may be arranged at a midpoint of a line segment that connects the first plug 31 and the second plug 32. The line segment that connects the first plug 31 and the second plug 32 refers to a line segment that connects the barycenter of the first plug 31 and the barycenter of the second plug 32 when the imaging device 100 is viewed in plan view. The expression "third plug 33 is arranged at a midpoint of the line segment" means that the third plug 33 overlaps the midpoint.

In the present embodiment, the shape of each pixel electrode is not particularly limited. The shape of each pixel electrode may be a rectangular shape having long sides and short sides or may be a polygonal shape, such as a regular hexagonal shape or a regular octagonal shape.

Figure 13A:
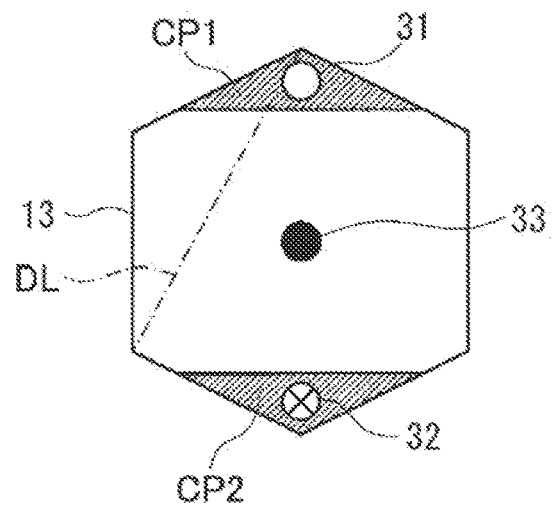
FIG. 13A is a plan view of a pixel electrode having a regular hexagonal shape.
Figure 13B:
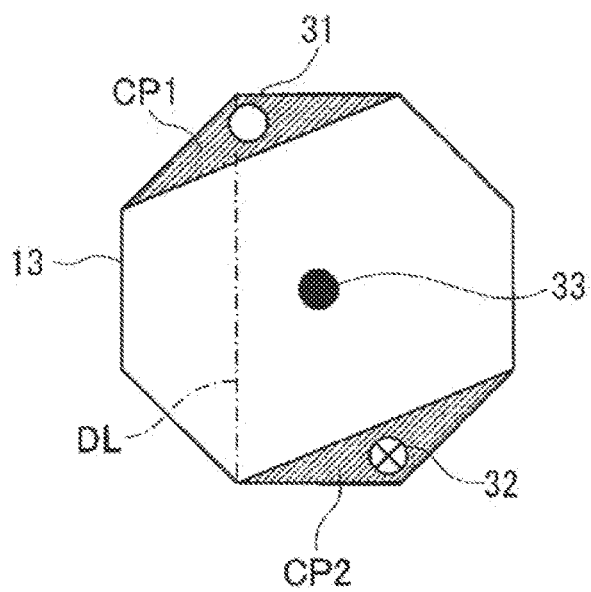
FIG. 13B is a plan view of a pixel electrode having a regular octagonal shape.

FIG. 13A illustrates a pixel electrode having a regular hexagonal shape. FIG. 13B illustrates a pixel electrode having a regular octagonal shape. In the case of the regular hexagonal shape, a diagonal line DL that does not pass through the center of the regular hexagonal shape is defined as a "long side". In the case of the regular octagonal shape, a diagonal line DL that does not pass through the center of the regular octagonal shape is also defined as a "long side". In the examples illustrated in FIGS. 13A and 13B, the distance between the first plug 31 and the second plug 32 is larger than the corresponding diagonal line DL, which is the long side of the first pixel electrode 13.

The second pixel electrode 14 and the third pixel electrode 15, which are the pixel electrodes in the lower layer, are provided with a notch CP1 in order to extend the first plug 31 to the lower side to connect to the semiconductor substrate 1. The third pixel electrode 15, which is a pixel electrode in the lower layer, is further provided with a notch CP2 in order to extend the second plug 32 to the lower side to connect to the semiconductor substrate 1.

Sixth Embodiment

Figure 14:
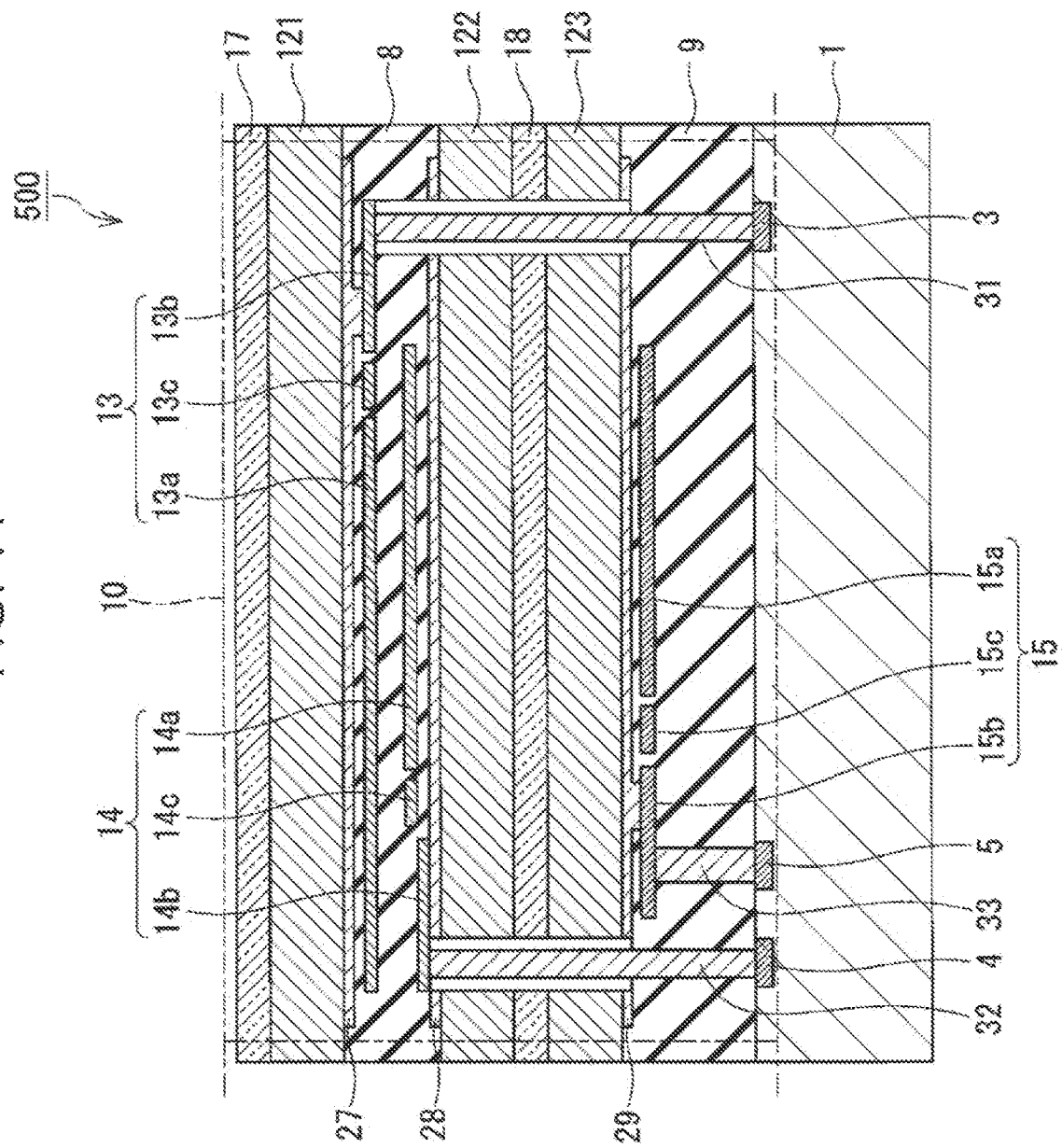
FIG. 14 is a sectional view of an imaging device according to a sixth embodiment of the present disclosure.

FIG. 14 illustrates a cross section of an imaging device 500 according to a sixth embodiment of the present disclosure. The imaging device 500 and the imaging device in each embodiment described above differ from each other in the structure of electrodes. In the imaging device 500, each first pixel electrode 13 has a first accumulation electrode 13a, a first readout electrode 13b, and a first transfer electrode 13c. Each second pixel electrode 14 has a second accumulation electrode 14a, a second readout electrode 14b, and a second transfer electrode 14c. Each third pixel electrode 15 has a third accumulation electrode 15a, a third readout electrode 15b, and a third transfer electrode 15c. The first transfer electrode 13c, the second transfer electrode 14c, and the third transfer electrode 15c may be omitted.

A first semiconductor layer 27 is provided between the first pixel electrode 13 and the first photoelectric conversion layer 121. Part of the insulating layer 8 lies between the first semiconductor layer 27 and the first pixel electrode 13. A second semiconductor layer 28 is provided between the second pixel electrode 14 and the second photoelectric conversion layer 122. Part of the insulating layer 8 lies between the second semiconductor layer 28 and the second pixel electrode 14. A third semiconductor layer 29 is provided between the third pixel electrode 15 and the third photoelectric conversion layer 123. Part of the insulating layer 9 lies between the third semiconductor layer 29 and the third pixel electrode 15. The first semiconductor layer 27, the second semiconductor layer 28, and the third semiconductor layer 29 are provided in order to more efficiently accumulate charge and are made of semiconductor material that is light transmissive.

The first accumulation electrode 13a and the first transfer electrode 13c face the first photoelectric conversion layer 121 with part of the insulating layer 8 being interposed therebetween or part of the insulating layer 8 and the first semiconductor layer 27 being interposed therebetween. At least part of the first readout electrode 13b is in contact with the first photoelectric conversion layer 121 directly or via the first semiconductor layer 27. The first plug 31 is connected to the first readout electrode 13b. The first accumulation electrode 13a, the first readout electrode 13b, and the first transfer electrode 13c are electrically connected to corresponding wires, which are not illustrated. A desired voltage can be applied to each of the first accumulation electrode 13a, the first readout electrode 13b, and the first transfer electrode 13c. The first accumulation electrode 13a can serve as an electrode for charge accumulation, that is, an electrode for attracting charge generated in the first photoelectric conversion layer 121 in response to the applied voltage and for causing the charge to be accumulated at the first photoelectric conversion layer 121. The first transfer electrode 13c is arranged between the first accumulation electrode 13a and the first readout electrode 13b when the imaging device 500 is viewed in plan view. The first transfer electrode 13c plays a role in blocking the accumulated charge and controlling transfer of the charge. Controlling voltages applied to the first accumulation electrode 13a, the first readout electrode 13b, and the first transfer electrode 13c allows charge generated in the first photoelectric conversion layer 121 to be accumulated inside the first photoelectric conversion layer 121 or at an interface of the first photoelectric conversion layer 121 and allows the generated charge to be taken out to the first charge accumulation region 3. The above descriptions of the first pixel electrode 13 can also be applied to the second pixel electrode 14 and the third pixel electrode 15 by replacing "first" with "second" or "third".

According to the structure of the electrodes in the present embodiment, charge that is generated in the photoelectric conversion layer can be efficiently collected and transferred, which leads to an improvement in the sensitivity. The structure of the electrodes in the present embodiment can be applied to all the embodiments described above.

The technology disclosed herein is useful for imaging devices. The imaging devices can be applied to imaging apparatuses, optical sensors, and so on. Examples of the imaging apparatuses include digital cameras, medical cameras, and surveillance cameras.

What is claimed is:
1. An imaging device comprising:
a semiconductor substrate; and
a plurality of pixels, wherein:
each of the plurality of pixels includes:
  a cell region;
  a first photoelectric conversion layer that converts light into first charge;
  a first pixel electrode that collects the first charge;
  a first plug that electrically connects the semiconductor substrate and the first pixel electrode;
  a second photoelectric conversion layer that is arranged between the first photoelectric conversion layer and the semiconductor substrate and that converts light into second charge;
  a second pixel electrode that collects the second charge; and
  a second plug that electrically connects the semiconductor substrate and the second pixel electrode,
the plurality of pixels includes a first pixel and a plurality of second pixels that are adjacent to the first pixel when viewed in a normal direction of the semiconductor substrate,
the plurality of pixels includes a plurality of first plugs and a plurality of second plugs, each of the plurality of first plugs being the first plug, each of the plurality of second plugs being the second plug, and
when viewed in the normal direction of the semiconductor substrate,
  the cell region includes the first plug, the second plug, the first pixel electrode and the second pixel electrode,
  a distance between two most closely adjacent plugs among the plurality of first plugs and the plurality of second plugs within the plurality of pixels is larger than or equal to one-half of a pixel pitch, the pixel pitch being a shortest one of distances between a center of the first pixel and centers of the plurality of second pixels, respectively, and
  the distance between the two most closely adjacent plugs is the shortest among all sets of two adjacent plugs selected from the group consisting of the plurality of first plugs and the plurality of second plugs.
2. The imaging device according to claim 1,
wherein, when viewed in the normal direction of the semiconductor substrate, a distance between the first plug and the second plug in each of the plurality of pixels is larger than or equal to one-half of the pixel pitch.

3. The imaging device according to claim 1,
wherein each of the plurality of pixels further includes
a third photoelectric conversion layer that is arranged between the second photoelectric conversion layer and the semiconductor substrate and that converts light into third charge,
a third pixel electrode that collects the third charge, and
a third plug that electrically connects the semiconductor substrate and the third pixel electrode.

4. The imaging device according to claim 3,
wherein, when viewed in the normal direction of the semiconductor substrate, a distance between the first plug and the third plug in each of the plurality of pixels is larger than or equal to one-half of the pixel pitch.

5. The imaging device according to claim 3,
wherein, when viewed in the normal direction of the semiconductor substrate, a distance between the second plug and the third plug in each of the plurality of pixels is larger than or equal to one-half of the pixel pitch.

6. The imaging device according to claim 3,
wherein, in each of the plurality of pixels, a distance between the first plug and the second plug is larger than a distance between the first plug and the third plug and is larger than a distance between the second plug and the third plug, when viewed in the normal direction of the semiconductor substrate.

7. The imaging device according to claim 1, further comprising:
a shield electrode between the first pixel and each of the plurality of second pixels, the shield electrode being maintained at a certain potential.

8. The imaging device according to claim 1, wherein the first plug and the second plug are arranged at positions at diagonal corners of the first pixel electrode.

9. The imaging device according to claim 1, wherein the first pixel electrode includes a first accumulation electrode that causes the first charge to be accumulated at the first photoelectric conversion layer, and a first readout electrode that is electrically connected to the semiconductor substrate via the first plug, and the second pixel electrode includes a second accumulation electrode that causes the second charge to be accumulated at the second photoelectric conversion layer, and a second readout electrode that is electrically connected to the semiconductor substrate via the second plug.

10. The imaging device according to claim 1, wherein:
the plurality of pixels are arranged in a matrix along a row direction and a column direction, and
the pixel pitch is equal to a distance between a center of the first pixel electrode of the first pixel and a center of a first pixel electrode of a second pixel among the plurality of second pixels adjacent to the first pixel in the row direction or the column direction.

11. An imaging device comprising:
a semiconductor substrate; and
a plurality of pixels, wherein:
each of the plurality of pixels includes:
a cell region;
a first photoelectric conversion layer that converts light into first charge;
a first pixel electrode that collects the first charge;
a first plug that electrically connects the semiconductor substrate and the first pixel electrode;
a second photoelectric conversion layer that is arranged between the first photoelectric conversion layer and the semiconductor substrate and that converts light into second charge;
a second pixel electrode that collects the second charge; and
a second plug that electrically connects the semiconductor substrate and the second pixel electrode,
the first pixel electrode has a long side and a short side, and
when viewed in a normal direction of the semiconductor substrate, a distance between the first plug and the second plug is larger than the long side of the first pixel electrode.

12. The imaging device according to claim 11, further comprising: a third photoelectric conversion layer that is arranged between the second photoelectric conversion layer and the semiconductor substrate and that converts light into third charge; a third pixel electrode that collects the third charge; and a third plug that electrically connects the semiconductor substrate and the third pixel electrode.

13. The imaging device according to claim 12, wherein the third plug is arranged in a center region of the third pixel electrode, the center region being a region including a barycenter of the third pixel electrode.

14. The imaging device according to claim 11,
wherein outer edges of the first pixel electrode and the second pixel electrode are aligned with each other.

15. The imaging device according to claim 11,
wherein the cell region is a region where the first pixel electrode overlaps the second pixel electrode in plan view.

16. An imaging device comprising:
a semiconductor substrate;
a first photoelectric conversion layer that converts light into first charge;
a first pixel electrode that collects the first charge;
a second photoelectric conversion layer that is arranged between the first photoelectric conversion layer and the semiconductor substrate and that converts light into second charge; and
a second pixel electrode that collects the second charge, wherein:
the first pixel electrode has a plurality of sides,
the second pixel electrode has a plurality of sides, and
when viewed in a normal direction of the semiconductor substrate,
a center of the first pixel electrode and a center of the second pixel electrode are arranged displaced from each other by one-half or more of each length of the plurality of sides of the second pixel electrode, and
two sides of the plurality of sides of the second pixel electrode cross two sides of the plurality of sides of the first pixel electrode, respectively.

17. The imaging device according to claim 16, further comprising: a first plug that electrically connects the semiconductor substrate and the first pixel electrode, wherein the first plug is arranged in a center region of the first pixel electrode, the center region being a region including a barycenter of the first pixel electrode.

18. The imaging device according to claim 16, further comprising: a second plug that electrically connects the semiconductor substrate and the second pixel electrode.

* * * * *